(12) United States Patent
Iwadate

(10) Patent No.: US 10,809,340 B2
(45) Date of Patent: Oct. 20, 2020

(54) MAGNETIC RESONANCE IMAGING APPARATUS AND PROGRAM

(71) Applicant: GENERAL ELECTRIC COMPANY, Schenectady, NY (US)

(72) Inventor: Yuji Iwadate, Tokyo (JP)

(73) Assignee: General Electric Company, Schenectady, NY (US)

( * ) Notice: Subject to any disclaimer, the term of this patent is extended or adjusted under 35 U.S.C. 154(b) by 148 days.

(21) Appl. No.: 16/086,766

(22) PCT Filed: Mar. 31, 2017

(86) PCT No.: PCT/US2017/025477
§ 371 (c)(1),
(2) Date: Sep. 20, 2018

(87) PCT Pub. No.: WO2017/173332
PCT Pub. Date: Oct. 5, 2017

(65) Prior Publication Data
US 2019/0107595 A1    Apr. 11, 2019

(30) Foreign Application Priority Data
Mar. 31, 2016 (JP) .................. 2016-071585

(51) Int. Cl.
  *G01R 33/565* (2006.01)
  *G01R 33/3415* (2006.01)
  *G01R 33/567* (2006.01)

(52) U.S. Cl.
  CPC ... *G01R 33/56509* (2013.01); *G01R 33/3415* (2013.01); *G01R 33/5676* (2013.01)

(58) Field of Classification Search
  None
  See application file for complete search history.

(56) References Cited

U.S. PATENT DOCUMENTS

| 7,693,569 B1 | 4/2010 | Brittain et al. |
| 2010/0171497 A1 | 7/2010 | Iwadate et al. |
| 2014/0145717 A1 | 5/2014 | Ozawa et al. |
| 2015/0247911 A1 | 9/2015 | Iwadate |

FOREIGN PATENT DOCUMENTS

| JP | 2008-283994 A | 11/2008 |
| JP | 2009-261574 A | 11/2009 |

OTHER PUBLICATIONS

International Search Report and Written Opinion for PCT/US2017/025477, dated Jun. 20, 2017, 10 pages.
European patent application 17776821.5 filed Sep. 17, 2018; European Search Report dated Nov. 4, 2019; 10 pages.

(Continued)

*Primary Examiner* — Paresh Patel

(57) ABSTRACT

An MRI apparatus comprising a signal analyzing unit for determining a feature quantity of a navigator signal, and obtaining data representing a temporal change of the feature quantity for each coil element; a transforming unit for transforming the data obtained for each coil element into frequency spectra $FS_1$ to $FS_{16}$; and a selecting unit for selecting a coil element for determining a signal value of a body-motion signal for the subject from among coil elements $E_1$ to $E_{16}$ based on the frequency spectra $FS_1$ to $FS_{16}$.

16 Claims, 41 Drawing Sheets

(56) References Cited

OTHER PUBLICATIONS

"Optimal Channel Selection Respiratory Self-Gating Sigmals" Grimm et al, International Society for Magnetic Resonance in Medicine, ISMRM, 2030 Addison Street, 7th Floor, Berkeley, CA 94704 USA, Apr. 7, 2013 (Apr. 7, 2013), XP040631345, p. 3749 (one page).
Li Feng et al; "XD-GRASP: Golden-angle radial MRI with reconstruction of extra motion-state dimensions using compressed sensing", Magnetic Resonance in Medicine, vol. 75, No. 2, Mar. 25, 2015 (Mar. 25, 2015), pp. 775-788, XP055362009, US ISSN: 0740-3194, DOI: 10.1002/mrm.25665.

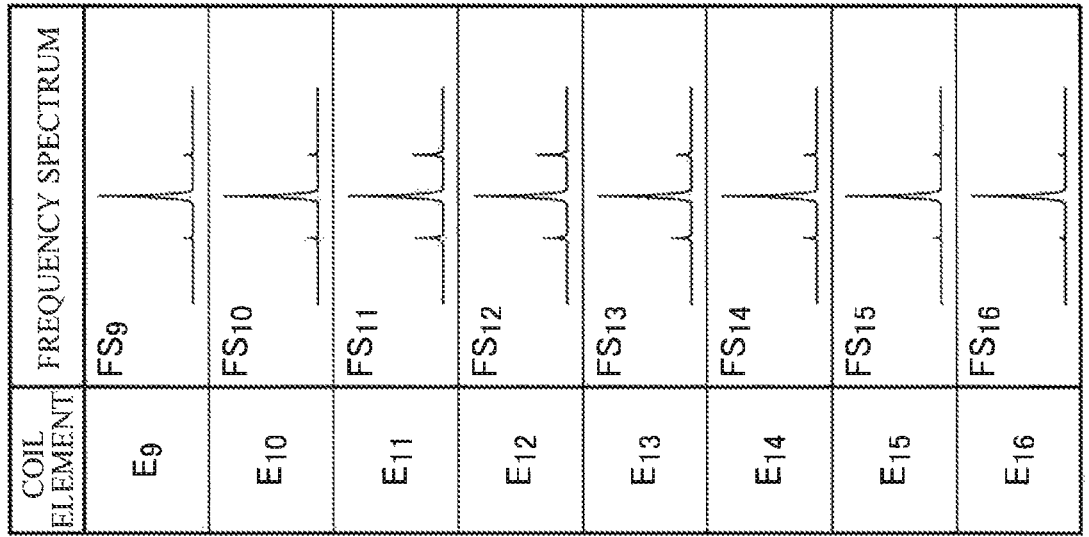
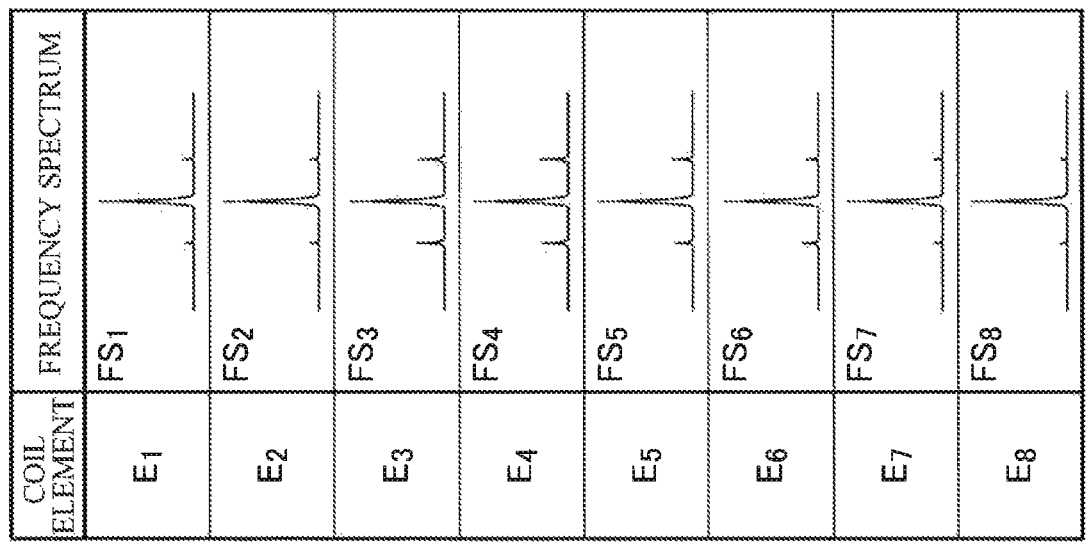
FIG. 17

| COIL ELEMENT | FREQUENCY SPECTRUM |
|---|---|
| $E_1$ | $FS_1$ $Q(q_1)$ $R(r_1)$ |
| $E_2$ | $FS_2$ $Q(q_2)$ $R(r_2)$ |
| $E_3$ | $FS_3$ $Q(q_3)$ $R(r_3)$ |
| $E_4$ | $FS_4$ $Q(q_4)$ $R(r_4)$ |
| $E_5$ | $FS_5$ $Q(q_5)$ $R(r_5)$ |
| $E_6$ | $FS_6$ $Q(q_6)$ $R(r_6)$ |
| $E_7$ | $FS_7$ $Q(q_7)$ $R(r_7)$ |
| $E_8$ | $FS_8$ $Q(q_8)$ $R(r_8)$ |

| COIL ELEMENT | FREQUENCY SPECTRUM |
|---|---|
| $E_9$ | $FS_9$ $Q(q_9)$ $R(r_9)$ |
| $E_{10}$ | $FS_{10}$ $Q(q_{10})$ $R(r_{10})$ |
| $E_{11}$ | $FS_{11}$ $Q(q_{11})$ $R(r_{11})$ |
| $E_{12}$ | $FS_{12}$ $Q(q_{12})$ $R(r_{12})$ |
| $E_{13}$ | $FS_{13}$ $Q(q_{13})$ $R(r_{13})$ |
| $E_{14}$ | $FS_{14}$ $Q(q_{14})$ $R(r_{14})$ |
| $E_{15}$ | $FS_{15}$ $Q(q_{15})$ $R(r_{15})$ |
| $E_{16}$ | $FS_{16}$ $Q(q_{16})$ $R(r_{16})$ |

FIG. 18

| COIL ELEMENT | FREQUENCY SPECTRUM | | HIGHER PEAK |
|---|---|---|---|
| E₁ | FS₁ Q(q₁) | R(r₁) | R(r₁) |
| E₂ | FS₂ Q(q₂) | R(r₂) | R(r₂) |
| E₃ | FS₃ Q(q₃) | R(r₃) | Q(q₃) |
| E₄ | FS₄ Q(q₄) | R(r₄) | R(r₄) |
| E₅ | FS₅ Q(q₅) | R(r₅) | R(r₅) |
| E₆ | FS₆ Q(q₆) | R(r₆) | Q(q₆) |
| E₇ | FS₇ Q(q₇) | R(r₇) | Q(q₇) |
| E₈ | FS₈ Q(q₈) | R(r₈) | Q(q₈) |

| COIL ELEMENT | FREQUENCY SPECTRUM | | HIGHER PEAK |
|---|---|---|---|
| E₉ | FS₉ Q(q₉) | R(r₉) | R(r₉) |
| E₁₀ | FS₁₀ Q(q₁₀) | R(r₁₀) | Q(q₁₀) |
| E₁₁ | FS₁₁ Q(q₁₁) | R(r₁₁) | R(r₁₁) |
| E₁₂ | FS₁₂ Q(q₁₂) | R(r₁₂) | R(r₁₂) |
| E₁₃ | FS₁₃ Q(q₁₃) | R(r₁₃) | Q(q₁₃) |
| E₁₄ | FS₁₄ Q(q₁₄) | R(r₁₄) | Q(q₁₄) |
| E₁₅ | FS₁₅ Q(q₁₅) | R(r₁₅) | Q(q₁₅) |
| E₁₆ | FS₁₆ Q(q₁₆) | R(r₁₆) | R(r₁₆) |

FIG. 19

| COIL ELEMENT | FREQUENCY SPECTRUM | | | HIGHER PEAK |
|---|---|---|---|---|
| $E_9$ | $FS_9$ | $Q(q_9)$ | $R(r_9)$ | $R(r_9)$ |
| $E_{10}$ | $FS_{10}$ | $Q(q_{10})$ | $R(r_{10})$ | $Q(q_{10})$ |
| $E_{11}$ | $FS_{11}$ | $Q(q_{11})$ | $R(r_{11})$ | $R(r_{11})$ |
| $E_{12}$ | $FS_{12}$ | $Q(q_{12})$ | $R(r_{12})$ | $R(r_{12})$ |
| $E_{13}$ | $FS_{13}$ | $Q(q_{13})$ | $R(r_{13})$ | $Q(q_{13})$ |
| $E_{14}$ | $FS_{14}$ | $Q(q_{14})$ | $R(r_{14})$ | $Q(q_{14})$ |
| $E_{15}$ | $FS_{15}$ | $Q(q_{15})$ | $R(r_{15})$ | $Q(q_{15})$ |
| $E_{16}$ | $FS_{16}$ | $Q(q_{16})$ | $R(r_{16})$ | $R(r_{16})$ |

| COIL ELEMENT | FREQUENCY SPECTRUM | | | HIGHER PEAK |
|---|---|---|---|---|
| $E_1$ | $FS_1$ | $Q(q_1)$ | $R(r_1)$ | $R(r_1)$ |
| $E_2$ | $FS_2$ | $Q(q_2)$ | $R(r_2)$ | $R(r_2)$ |
| $E_3$ | $FS_3$ | $Q(q_3)$ | $R(r_3)$ | $Q(q_3)$ |
| $E_4$ | $FS_4$ | $Q(q_4)$ | $R(r_4)$ | $R(r_4)$ |
| $E_5$ | $FS_5$ | $Q(q_5)$ | $R(r_5)$ | $R(r_5)$ |
| $E_6$ | $FS_6$ | $Q(q_6)$ | $R(r_6)$ | $Q(q_6)$ |
| $E_7$ | $FS_7$ | $Q(q_7)$ | $R(r_7)$ | $Q(q_7)$ |
| $E_8$ | $FS_8$ | $Q(q_8)$ | $R(r_8)$ | $Q(q_8)$ |

FIG. 20

| COIL ELEMENT | FREQUENCY SPECTRUM | HIGHER PEAK |
|---|---|---|
| $E_1$ | $FS_1$ $Q(q_1)$ $P(p_1)$ $R(r_1)$ | $R(r_1)$ |
| $E_2$ | $FS_2$ $Q(q_2)$ $P(p_2)$ $R(r_2)$ | $R(r_2)$ |
| $E_3$ | $FS_3$ $Q(q_3)$ $P(p_3)$ $R(r_3)$ | $Q(q_3)$ |
| $E_4$ | $FS_4$ $Q(q_4)$ $P(p_4)$ $R(r_4)$ | $R(r_4)$ |
| $E_5$ | $FS_5$ $Q(q_5)$ $P(p_5)$ $R(r_5)$ | $R(r_5)$ |
| $E_6$ | $FS_6$ $Q(q_6)$ $P(p_6)$ $R(r_6)$ | $Q(q_6)$ |
| $E_7$ | $FS_7$ $Q(q_7)$ $P(p_7)$ $R(r_7)$ | $Q(q_7)$ |
| $E_8$ | $FS_8$ $Q(q_8)$ $P(p_8)$ $R(r_8)$ | $Q(q_8)$ |
| $E_9$ | $FS_9$ $Q(q_9)$ $P(p_9)$ $R(r_9)$ | $R(r_9)$ |
| $E_{10}$ | $FS_{10}$ $Q(q_{10})$ $P(p_{10})$ $R(r_{10})$ | $Q(q_{10})$ |
| $E_{11}$ | $FS_{11}$ $Q(q_{11})$ $P(p_{11})$ $R(r_{11})$ | $R(r_{11})$ |
| $E_{12}$ | $FS_{12}$ $Q(q_{12})$ $P(p_{12})$ $R(r_{12})$ | $R(r_{12})$ |
| $E_{13}$ | $FS_{13}$ $Q(q_{13})$ $P(p_{13})$ $R(r_{13})$ | $Q(q_{13})$ |
| $E_{14}$ | $FS_{14}$ $Q(q_{14})$ $P(p_{14})$ $R(r_{14})$ | $Q(q_{14})$ |
| $E_{15}$ | $FS_{15}$ $Q(q_{15})$ $P(p_{15})$ $R(r_{15})$ | $Q(q_{15})$ |
| $E_{16}$ | $FS_{16}$ $Q(q_{16})$ $P(p_{16})$ $R(r_{16})$ | $R(r_{16})$ |

FIG. 22

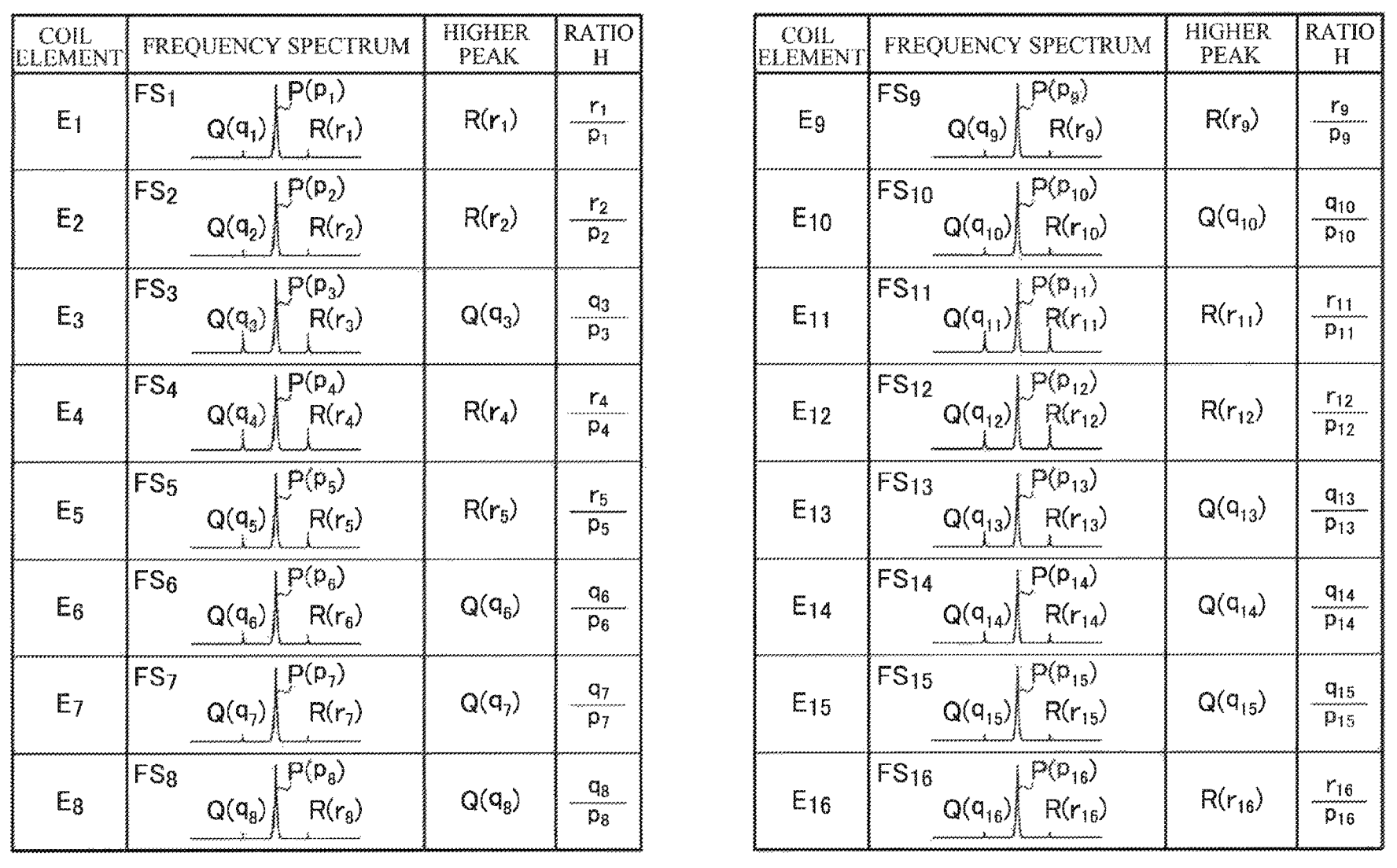

| COIL ELEMENT | FREQUENCY SPECTRUM | HIGHER PEAK | RATIO H |
|---|---|---|---|
| $E_1$ | $FS_1$ | $R(r_1)$ | $\dfrac{r_1}{p_1}$ |
| $E_2$ | $FS_2$ | $R(r_2)$ | $\dfrac{r_2}{p_2}$ |
| $E_3$ | $FS_3$ | $Q(q_3)$ | $\dfrac{q_3}{p_3}$ |
| $E_4$ | $FS_4$ | $R(r_4)$ | $\dfrac{r_4}{p_4}$ |
| $E_5$ | $FS_5$ | $R(r_5)$ | $\dfrac{r_5}{p_5}$ |
| $E_6$ | $FS_6$ | $Q(q_6)$ | $\dfrac{q_6}{p_6}$ |
| $E_7$ | $FS_7$ | $Q(q_7)$ | $\dfrac{q_7}{p_7}$ |
| $E_8$ | $FS_8$ | $Q(q_8)$ | $\dfrac{q_8}{p_8}$ |
| $E_9$ | $FS_9$ | $R(r_9)$ | $\dfrac{r_9}{p_9}$ |
| $E_{10}$ | $FS_{10}$ | $Q(q_{10})$ | $\dfrac{q_{10}}{p_{10}}$ |
| $E_{11}$ | $FS_{11}$ | $R(r_{11})$ | $\dfrac{r_{11}}{p_{11}}$ |
| $E_{12}$ | $FS_{12}$ | $R(r_{12})$ | $\dfrac{r_{12}}{p_{12}}$ |
| $E_{13}$ | $FS_{13}$ | $Q(q_{13})$ | $\dfrac{q_{13}}{p_{13}}$ |
| $E_{14}$ | $FS_{14}$ | $Q(q_{14})$ | $\dfrac{q_{14}}{p_{14}}$ |
| $E_{15}$ | $FS_{15}$ | $Q(q_{15})$ | $\dfrac{q_{15}}{p_{15}}$ |
| $E_{16}$ | $FS_{16}$ | $R(r_{16})$ | $\dfrac{r_{16}}{p_{16}}$ |

FIG. 23

| COIL ELEMENT | FREQUENCY SPECTRUM | HIGHER PEAK | RATIO H |
|---|---|---|---|
| $E_1$ | $FS_1$ | $R(r_1)$ | $\frac{r_1}{p_1}$ |
| $E_2$ | $FS_2$ | $R(r_2)$ | $\frac{r_2}{p_2}$ |
| $E_3$ | $FS_3$ | $Q(q_3)$ | $\frac{q_3}{p_3}$ |
| $E_4$ | $FS_4$ | $R(r_4)$ | $\frac{r_4}{p_4}$ |
| $E_5$ | $FS_5$ | $R(r_5)$ | $\frac{r_5}{p_5}$ |
| $E_6$ | $FS_6$ | $Q(q_6)$ | $\frac{q_6}{p_6}$ |
| $E_7$ | $FS_7$ | $Q(q_7)$ | $\frac{q_7}{p_7}$ |
| $E_8$ | $FS_8$ | $Q(q_8)$ | $\frac{q_8}{p_8}$ |
| $E_9$ | $FS_9$ | $R(r_9)$ | $\frac{r_9}{p_9}$ |
| $E_{10}$ | $FS_{10}$ | $Q(q_{10})$ | $\frac{q_{10}}{p_{10}}$ |
| $E_{11}$ | $FS_{11}$ | $R(r_{11})$ | $\frac{r_{11}}{p_{11}}$ |
| $E_{12}$ | $FS_{12}$ | $R(r_{12})$ | $\frac{r_{12}}{p_{12}}$ |
| $E_{13}$ | $FS_{13}$ | $Q(q_{13})$ | $\frac{q_{13}}{p_{13}}$ |
| $E_{14}$ | $FS_{14}$ | $Q(q_{14})$ | $\frac{q_{14}}{p_{14}}$ |
| $E_{15}$ | $FS_{15}$ | $Q(q_{15})$ | $\frac{q_{15}}{p_{15}}$ |
| $E_{16}$ | $FS_{16}$ | $R(r_{16})$ | $\frac{r_{16}}{p_{16}}$ |

FIG. 24

MAGNETIC RESONANCE IMAGING APPARATUS AND PROGRAM

This application is a national phase application under 35 U.S.C. 371 of PCT Application No. PCT/US2017/025477, filed Mar. 31, 2017, which claims priority to Japanese Patent Application No. 2016-071585, filed on Mar. 31, 2016, the entirety of both is hereby incorporated by reference.

BACKGROUND

The present invention relates to a magnetic resonance imaging apparatus for obtaining body-motion signals from a subject, and a program applied to the magnetic resonance imaging apparatus.

A method of obtaining information on respiration using a pencil-beam RF pulse has been known as one of respiration-gated imaging techniques. By using the pencil-beam RF pulse, excitation of a lung and a liver may be achieved cylindrically passing through them in an SI (superior-inferior) direction; therefore, the method is suitable for detection of motion of an edge of the liver in the SI-direction, and is used particularly in abdominal imaging.

The method, however, has a problem that it causes a loud noise during imaging because a gradient magnetic field is quickly and steeply changed. To address the problem, a method of achieving excitation using a non-selective RF pulse has been studied.

The method using a non-selective RF pulse is expected to reduce the noise during imaging because excitation is achieved without quickly and steeply changing a gradient magnetic field.

The method using a non-selective RF pulse, however, causes a wide range to be excited, so that in addition to the liver and lungs, body parts (a neck, for example) surrounding the liver and lungs are also excited. Therefore, MR signals received by a receive coil contain signal components from body parts (a neck, for example) less pertinent to respiratory motion. From an effect of the signal components, respiration signals cannot be given a high amplitude, resulting in a problem that it is difficult to obtain respiration signals with high quality in which respiration-induced motion in a subject is fully reflected.

Accordingly, a method has been studied comprising, when performing the method using a non-selective RF pulse, identifying a coil element from among a plurality of coil elements provided in a receive coil that receives MR signals fully reflecting respiratory motion. Identification of a coil element from among a plurality of coil elements that receives MR signals fully reflecting respiratory motion may make it possible to obtain respiration signals with high quality in which respiration-induced motion in a subject is fully reflected.

When disposing a receive coil over a subject, however, the position of the coil elements relative to a subject's body part to be imaged varies from subject to subject. This poses a problem that it is difficult to identify a coil element from among the plurality of coil elements that receives MR signals fully reflecting respiratory motion.

For such reasons, it is desired to provide a technique capable of selecting a coil element suitable for determining a signal value of a respiration signal.

SUMMARY

The present invention, in its first aspect, is a magnetic resonance imaging apparatus comprising a scanning section for performing a first sequence a plurality of number of times, said first sequence being for generating a first MR signal containing information on body motion from a moving body part in a subject; a coil apparatus having a plurality of coil elements for receiving said first MR signal; a signal analyzing unit for obtaining data, said signal analyzing unit determining a feature quantity of a navigator signal containing information on said first MR signal received by each of said plurality of coil elements, and obtaining data representing a temporal change of said feature quantity for each said coil element; a transforming unit for transforming said data obtained for each said coil element into a frequency spectrum; and a selecting unit for selecting a coil element for determining a signal value of a body-motion signal for said subject from among said plurality of coil elements based on said frequency spectrum.

The present invention, in its second aspect, is a program applied to a magnetic resonance imaging apparatus comprising a scanning section for performing a first sequence a plurality of number of times, said first sequence being for generating a first MR signal containing information on body motion from a moving body part in a subject, and a coil apparatus having a plurality of coil elements for receiving said first MR signal, said program causing a computer to execute: signal analyzing processing for obtaining data, said signal analyzing processing determining a feature quantity of a navigator signal containing information on said first MR signal received by each of said plurality of coil elements, and obtaining data representing a temporal change of said feature quantity for each said coil element; transforming processing of transforming said data obtained for each said coil element into a frequency spectrum; and selecting processing of selecting a coil element for determining a signal value of a body-motion signal for said subject from among said plurality of coil elements based on said frequency spectrum.

A feature quantity of a navigator signal containing information on the first MR signal received by each of a plurality of coil elements is determined, and data representing a temporal change of the feature quantity is obtained for each coil element. The data is transformed into a frequency spectrum. Since the frequency spectrum exhibits a peak reflecting subject's motion, a coil element suitable for determining a body motion signal from a subject may be selected from among the plurality of coil elements by obtaining the frequency spectrum.

BRIEF DESCRIPTION OF THE DRAWINGS

FIG. 17 is a diagram schematically showing frequency spectra $FS_1$ to $FS_{16}$ respectively obtained for the coil elements;

FIG. 18 is a diagram explaining Step ST23;

FIG. 19 is a diagram showing higher peaks;

FIG. 20 is a diagram showing exemplary eight selected coil elements;

FIG. 22 is a diagram showing peaks appearing near 0 Hz in the frequency spectra $FS_1$ to $FS_{16}$;

FIG. 23 is a diagram showing a ratio H determined for each frequency spectrum;

FIG. 24 is a diagram showing exemplary eight selected coil elements;

DETAILED DESCRIPTION

Figure 1:
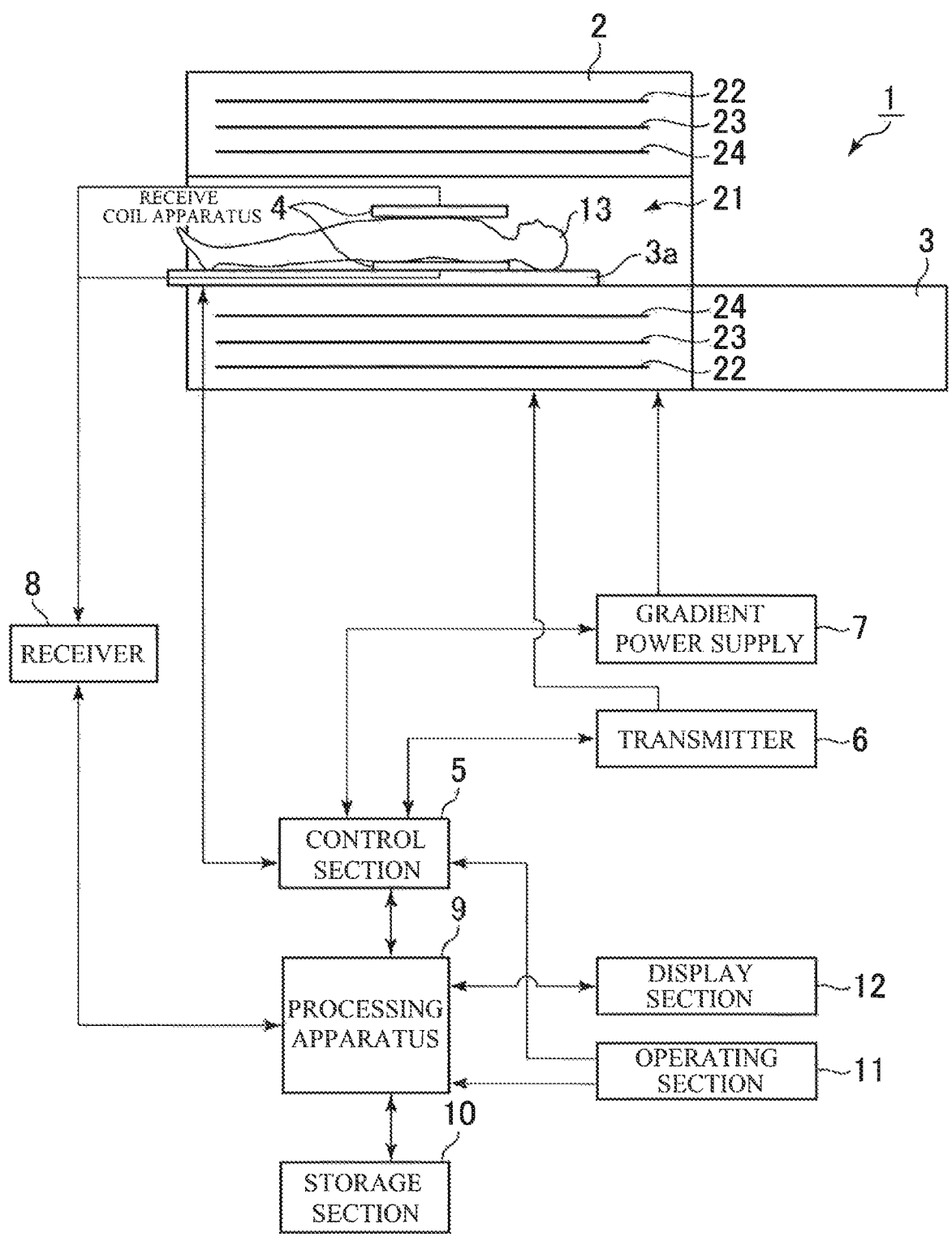
FIG. 1 is a schematic diagram of a magnetic resonance imaging apparatus in an embodiment of the present invention.

FIG. 1 is a schematic diagram of a magnetic resonance imaging apparatus in one embodiment of the present invention. The magnetic resonance imaging apparatus (referred to as "MRI apparatus" hereinbelow) 1 comprises a magnet 2, a table 3, and a receive coil apparatus 4.

The magnet 2 has a reception space 21 in which a subject 13 is received. The magnet 2 also has coils, such as a superconductive coil 22, a gradient coil 23, and an RF coil 24. The superconductive coil 22 applies a static magnetic field, the gradient coil 23 applies a gradient pulse, and the RF coil 24 applies an RF pulse.

The table 3 has a cradle 3a. The cradle 3a is configured to be movable into the reception space 21. It is by the cradle 3a that the subject 13 is carried into the reception space 21. The receive coil apparatus 4 is attached to a torso of the subject 13.

Figure 2:
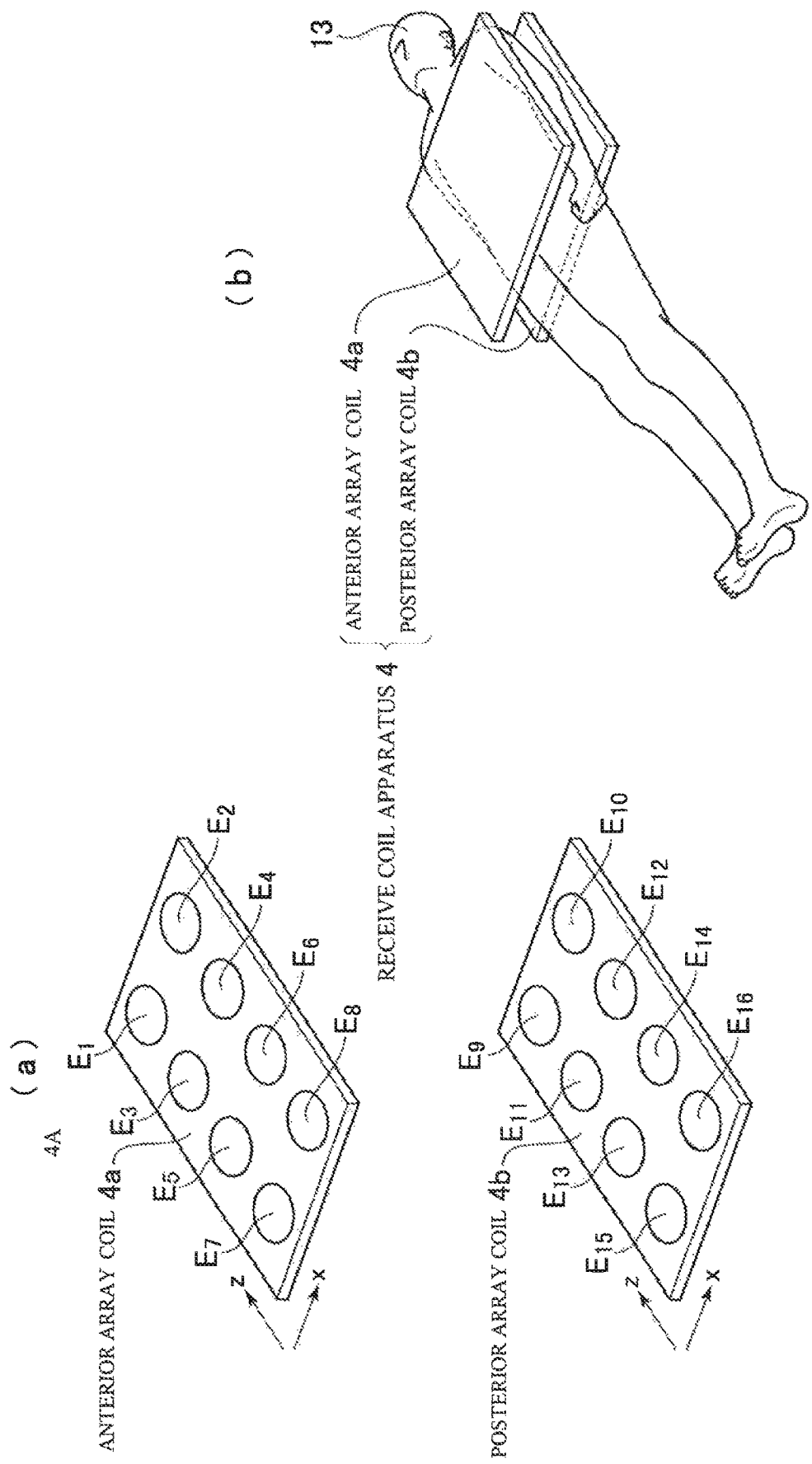
FIG. 2 is a diagram explaining a receive coil apparatus 4.

FIG. 2 is a diagram explaining the receive coil apparatus 4. The receive coil apparatus 4 has a plurality of coil elements. While the following description will be addressed to a case in which the receive coil apparatus 4 has sixteen coil elements, the number of coil elements in the receive coil apparatus 4 is not limited to sixteen, and the present invention may be applied to a case in which the receive coil apparatus 4 has two or more coil elements.

The receive coil apparatus 4 has an anterior array coil 4a and a posterior array coil 4b. The anterior array coil 4a is a coil disposed on the front (abdominal) side of the subject 13, and has eight coil elements $E_1$ to $E_8$. The eight coil elements $E_1$ to $E_8$ are arranged in four rows and two columns.

The posterior array coil 4b is a coil disposed on the posterior (back) side of the subject 13, and has eight coil elements $E_9$ to $E_{16}$. The eight coil elements $E_9$ to $E_{16}$ are arranged in four rows and two columns.

In the present embodiment, the anterior array coil 4a and posterior array coil 4b are attached to the subject sandwiching the subject's torso.

Figure 3:
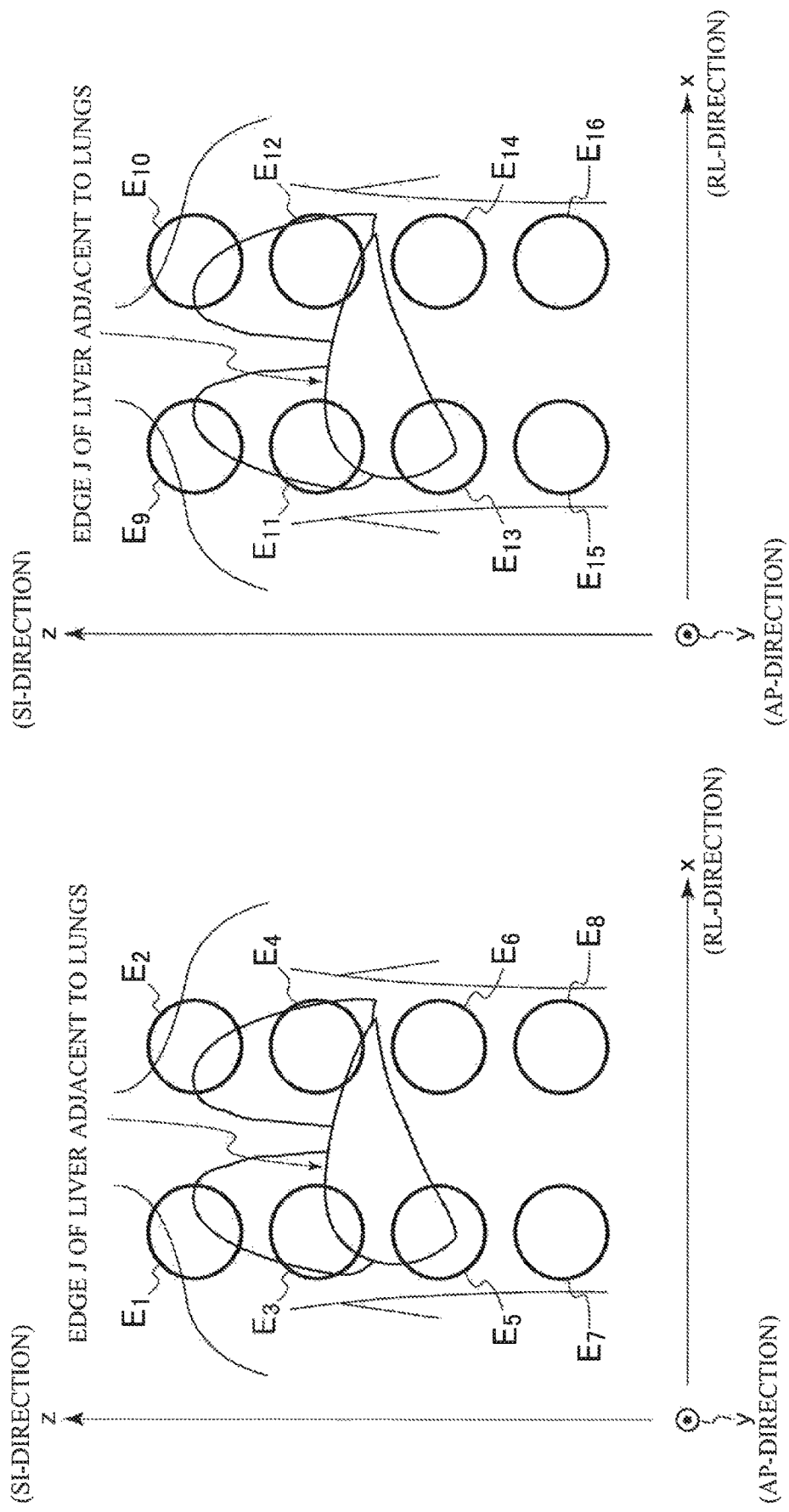
FIG. 3 is a diagram schematically showing a positional relationship between coil elements in an anterior array coil 4a and a posterior array coil 4b, and a body part to be imaged.

FIG. 3 is a diagram schematically showing a positional relationship between the coil elements in the anterior array coil 4a and posterior array coil 4b, and a body part to be imaged. FIG. 3 on its left side schematically shows a positional relationship between the coil elements $E_1$ to $E_5$ in the anterior array coil 4a and the body part to be imaged in a zx-plane. FIG. 3 on its right side schematically shows a positional relationship between the coil elements $E_9$ to $E_{16}$ in the posterior array coil 4b and the body part to be imaged in the zx-plane. In the present embodiment, the x-direction corresponds to a right-left (RL) direction, the y-direction corresponds to an anterior-posterior (AP) direction, and the z-direction corresponds to a superior-inferior (SI) direction.

The coil elements $E_1$ to $E_5$ in the anterior array coil 4a lie over the front surface of the subject's torso. The coil elements $E_1$ and $E_2$ lie near the subject's shoulders, the coil elements $E_3$, $E_4$, $E_5$, and $E_6$ lie near the subject's liver (an edge J of the liver adjacent to the lungs), and the coil elements $E_7$ and $E_8$ lie near the subject's hip.

The coil elements $E_9$ to $E_{16}$ in the posterior array coil 4b lie over the rear surface (back side) of the subject's torso. The coil elements $E_9$ and $E_{10}$ lie near the subject's shoulders, the coil element $E_{11}$, $E_{12}$, $E_{13}$, and $E_{14}$ lie near the subject's liver (the edge J of the liver adjacent to the lungs), and the coil elements $E_{15}$ and $E_{16}$ lie near the subject's hip. Referring back to FIG. 1, the description will be continued.

The MRI apparatus 1 further comprises a control section 5, a transmitter 6, a gradient power supply 7, a receiver 8, and a processing apparatus 9, a storage section 10, an operating section 11, and a display section 12.

The transmitter 6 supplies electric current to the RF coil 24, and the gradient power supply 7 supplies electric current to the gradient coil 23. The receiver 8 applies signal processing, such as demodulation/detection, to signals received from the receive coil apparatus 4. The magnet 2, control section 5, transmitter 6, and gradient power supply 7 together constitute the scanning section.

Figure 4:
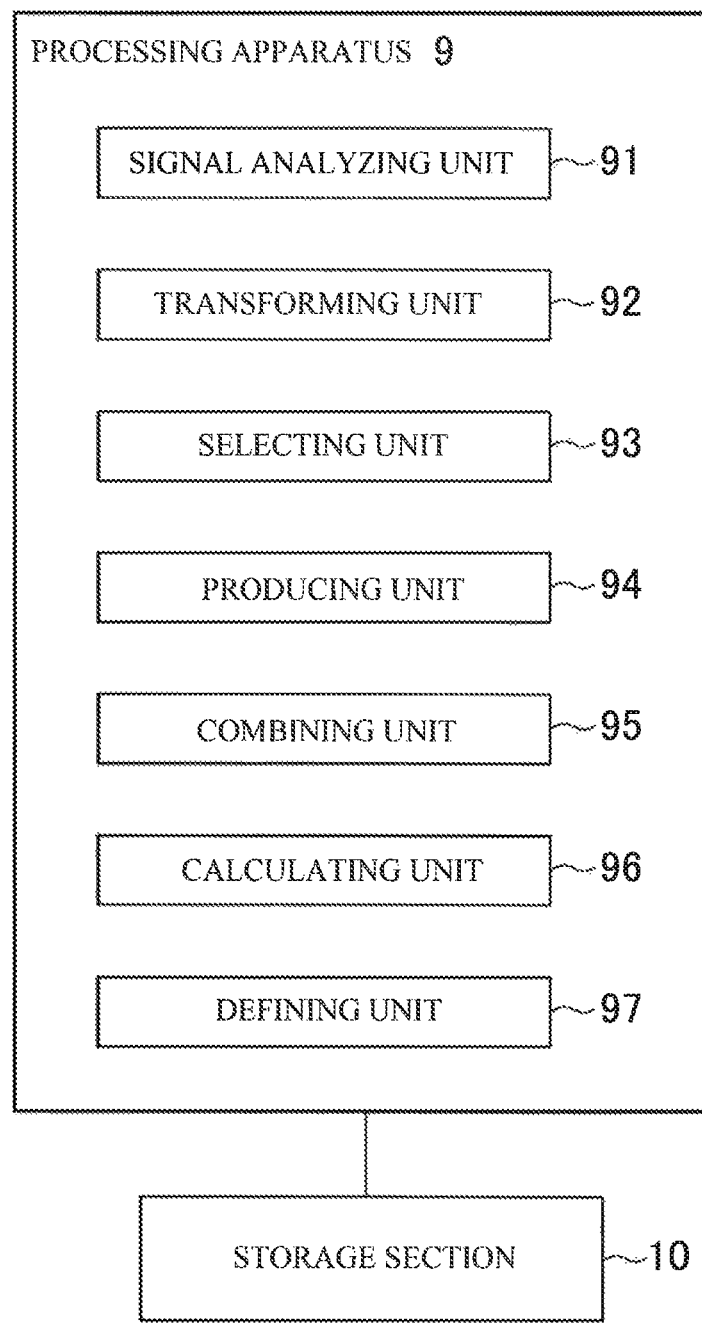
FIG. 4 is a diagram explaining a processing apparatus 9 and what it implements.

The storage section 10 stores therein programs executed by the processing apparatus 9, and the like. The storage section 10 may be a non-transitory recording medium, such as a hard disk or CD-ROM. The processing apparatus 9 loads a program stored in the storage section 10 and operates as a processor for executing processing written in the program. The processing apparatus 9 implements several kinds of units by executing processing written in the program. FIG. 4 is a diagram explaining the units the processing apparatus 9 implements.

The signal analyzing unit 91 determines a feature quantity for a navigator signal, which will be discussed later. The signal analyzing unit 91 is used for obtaining data. The transforming unit 92 transforms data representing a temporal change of the feature quantity determined by the signal analyzing unit 91 into a frequency spectrum. The selecting unit 93 selects a coil element used for determining a signal value of a respiration signal from among sixteen coil elements $E_1$ to $E_{16}$ provided in the coil apparatus 4 based on the frequency spectrum. The producing unit 94 produces a profile representing signal intensity in the z-direction (SI-direction) based on the navigator signal.

The combining unit 95 combines profiles. The calculating unit 96 calculates a signal value of a respiration signal based on the profile combined by the combining unit 95. A combination of the combining unit 95 and the calculating unit 96 is used for determining a signal value of a body-motion signal. The defining unit 97 defines a window for deciding whether to perform an imaging sequence or not, which will be discussed later.

The MRI apparatus 1 comprises a computer including the processing apparatus 9. The processing apparatus 9 loads programs stored in the storage section 10 to thereby implement the signal analyzing unit 91 to defining unit 97, and the like. It should be noted that the processing apparatus 9 may implement the signal analyzing unit 91 to defining unit 97 by one processor or by two or more processors. The program executed by the processing apparatus 9 may be stored in one storage section or separately in a plurality of storage sections.

The operating section 11 is operated by an operator to input several kinds of information to the control section 5, processing apparatus 9, and the like. The display section 12 displays several kinds of information. The MRI apparatus 1 is configured as described above.

Figure 5:
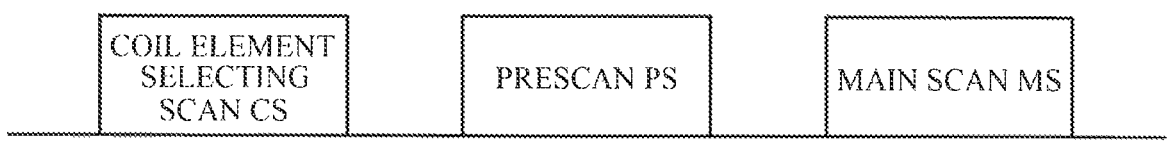
FIG. 5 is a diagram explaining scans performed in the present embodiment.

FIG. 5 is a diagram explaining scans performed in the present embodiment. In the present embodiment, a coil element selecting scan CS, a prescan PS, a main scan MS, and the like are performed.

The coil element selecting scan CS is a scan for selecting a coil element suitable for obtaining a respiration signal in the prescan PS and main scan MS, which will be discussed later.

The prescan PS is a scan for acquiring a respiration signal required for defining a window W (see FIG. 36), which will be discussed later.

The main scan MS is a scan for acquiring an image of a body part to be imaged synchronously with the respiration signal. Now the coil element selecting scan CS will be first described hereinbelow.

Figure 6:
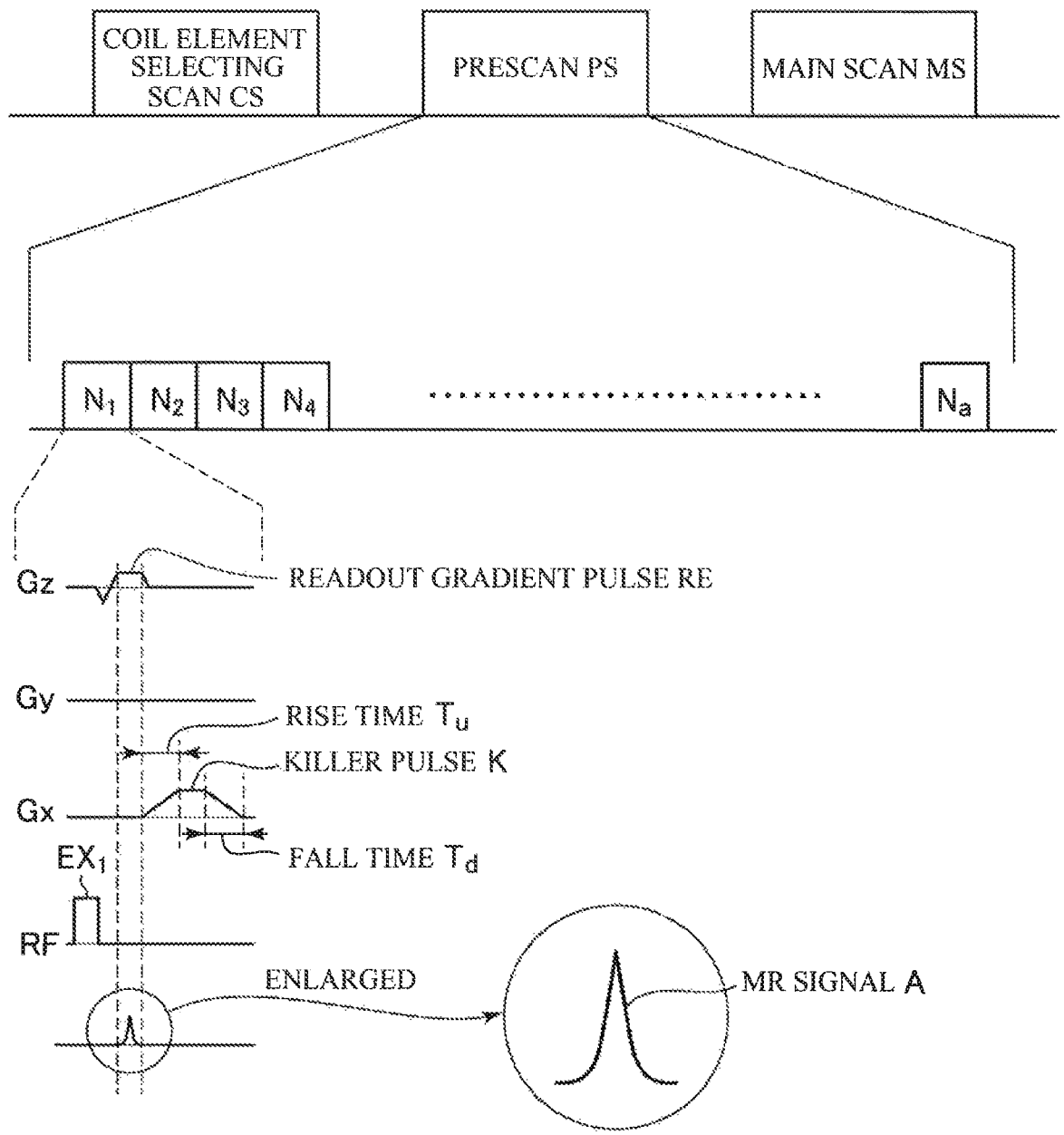
FIG. 6 is a diagram explaining a coil element selecting scan CS.

FIG. 6 is a diagram explaining the coil element selecting scan CS. In the coil element selecting scan CS, a plurality of navigator sequences $N_1$ to $N_a$ are performed. The navigator sequences will be described below. Since the navigator sequences $N_1$ to $N_a$ are expressed by the same sequence chart, the following description of the navigator sequences will focus upon a representative navigator sequence $N_1$ from among the navigator sequences $N_1$ to $N_a$.

The navigator sequence $N_1$ is a sequence for generating an MR signal containing information on respiration from a body part moving with respiration. The navigator sequence $N_1$ comprises an excitation pulse $EX_1$, a readout gradient pulse RE, and a killer pulse K. The excitation pulse $EX_1$ is applied by the RF coil 24, and the readout gradient pulse RE and killer pulse K are applied by the gradient coil 23. In the present embodiment, no gradient pulse is applied while the excitation pulse $EX_1$ is being applied. Therefore, the excitation pulse $EX_1$ is a non-selective RF pulse for exciting the subject without performing slice selection. Since the excitation pulse $EX_1$ is a non-selective RF pulse, a wide range of the body part (a torso including the liver and lungs, for example) may be excited by applying the excitation pulse $EX_1$. Since no gradient pulse is applied during excitation in the present embodiment, excitation may be achieved without making a loud noise. After applying the excitation pulse $EX_1$, the readout gradient pulse RE is applied. An MR signal A is generated by applying the readout gradient pulse RE. After the readout gradient pulse RE is applied, the killer pulse K for canceling transverse magnetization is applied. The killer pulse K may be applied in any one of the Gx-, Gy-, and Gz-axes. The present embodiment shows a case in which it is applied in the Gx-axis. It should be noted that smaller slew rates SR for a rise time Tu and a fall time Td of the killer pulse K are more desirable for reducing noise during performance of the navigator sequence $N_1$. The slew rate SR may be set to SR=20 (T/m/s), for example.

Figure 7:
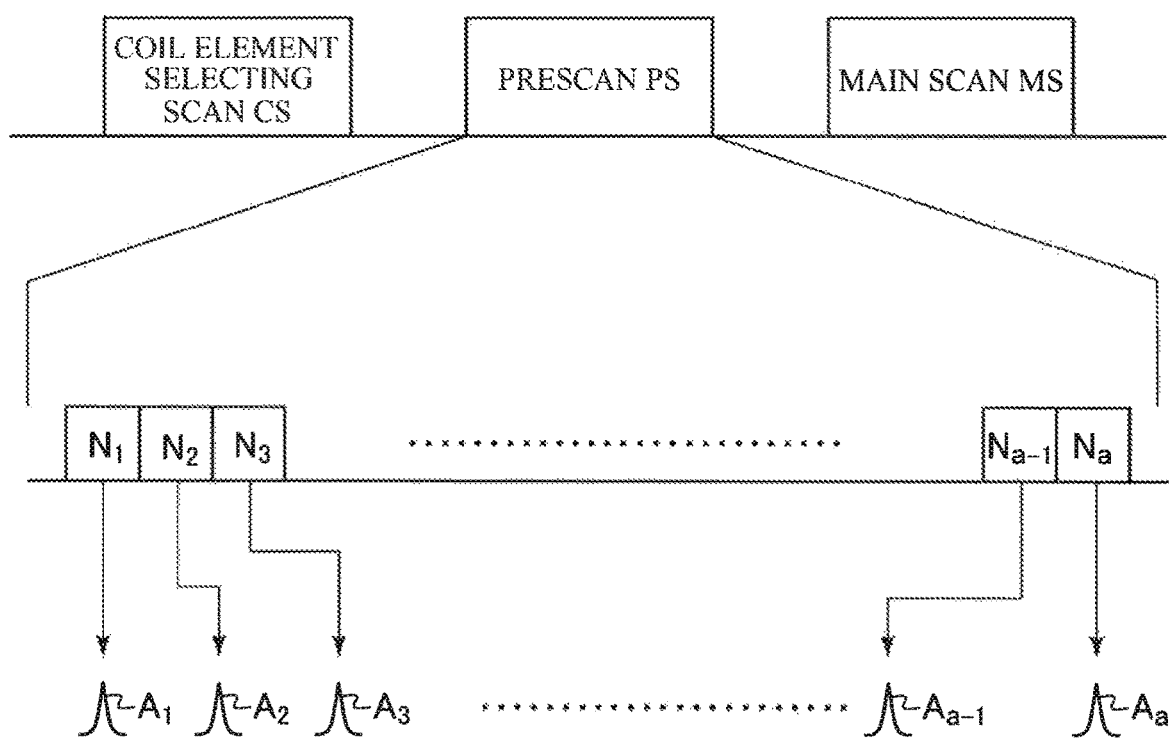
FIG. 7 is a diagram showing MR signals A obtained by navigator sequences $N_1$ to $N_a$.

While the MR signal A obtained by the navigator sequence $N_1$ is described in FIG. 6, the other navigator sequences $N_2$ to $N_a$ are also expressed by the same sequence chart as that for the navigator sequence $N_1$. Therefore, when the other navigator sequences $N_2$ to $N_a$ are performed, the MR signal A is generated as well. FIG. 7 shows the MR signals A generated by the navigator sequences $N_1$ to $N_a$. In FIG. 7, subscripts "1," "2," "3," ..., "a-1," and "a" are added to the symbol A to distinguish the MR signals A generated by the navigator sequences $N_1$ to $N_a$ from one another.

In the present embodiment, coil elements suitable for obtaining a subject's respiration signal are selected before performing the prescan PS and main scan MS, based on the MR signals $A_1$ to $A_a$ obtained by the coil element selecting scan CS.

After selecting coil elements, the prescan PS and main scan MS are performed.

Figure 8:
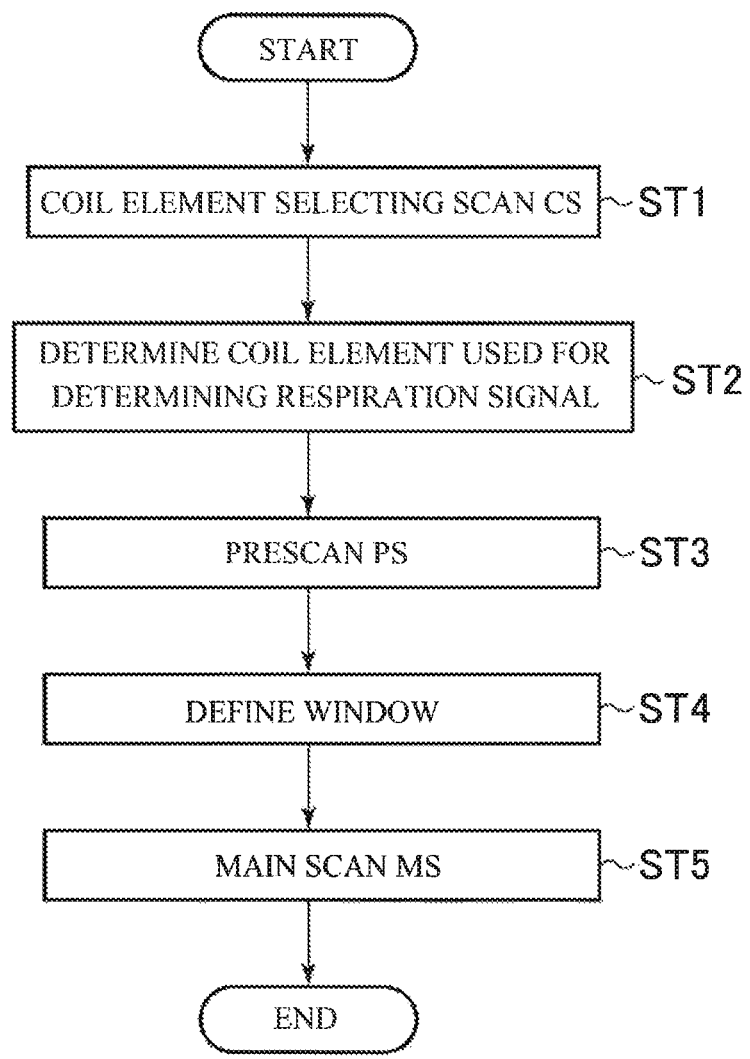
FIG. 8 is a chart showing the flow.

Now the flow for performing the coil element selecting scan CS, prescan PS, and main scan MS will be explained hereinbelow referring to FIG. 8.

At Step ST1, the coil element selecting scan CS is performed. When performing the coil element selecting scan CS, the control section 5 (see FIG. 1) sends data for the RF pulse in the sequence used in the coil element selecting scan CS to the transmitter 6, and sends data for the gradient pulse in the sequence used in the coil element selecting scan CS to the gradient power supply 7. The transmitter 6 supplies electric current to the RF coil 24 based on the data received from the control section 5, while the gradient power supply 7 supplies electric current to the gradient coil 23 based on the data received from the control section 5. The coil element selecting scan CS can thus be performed.

In the coil element selecting scan CS, a navigator sequence $N_1$ is first performed.

Figure 9:
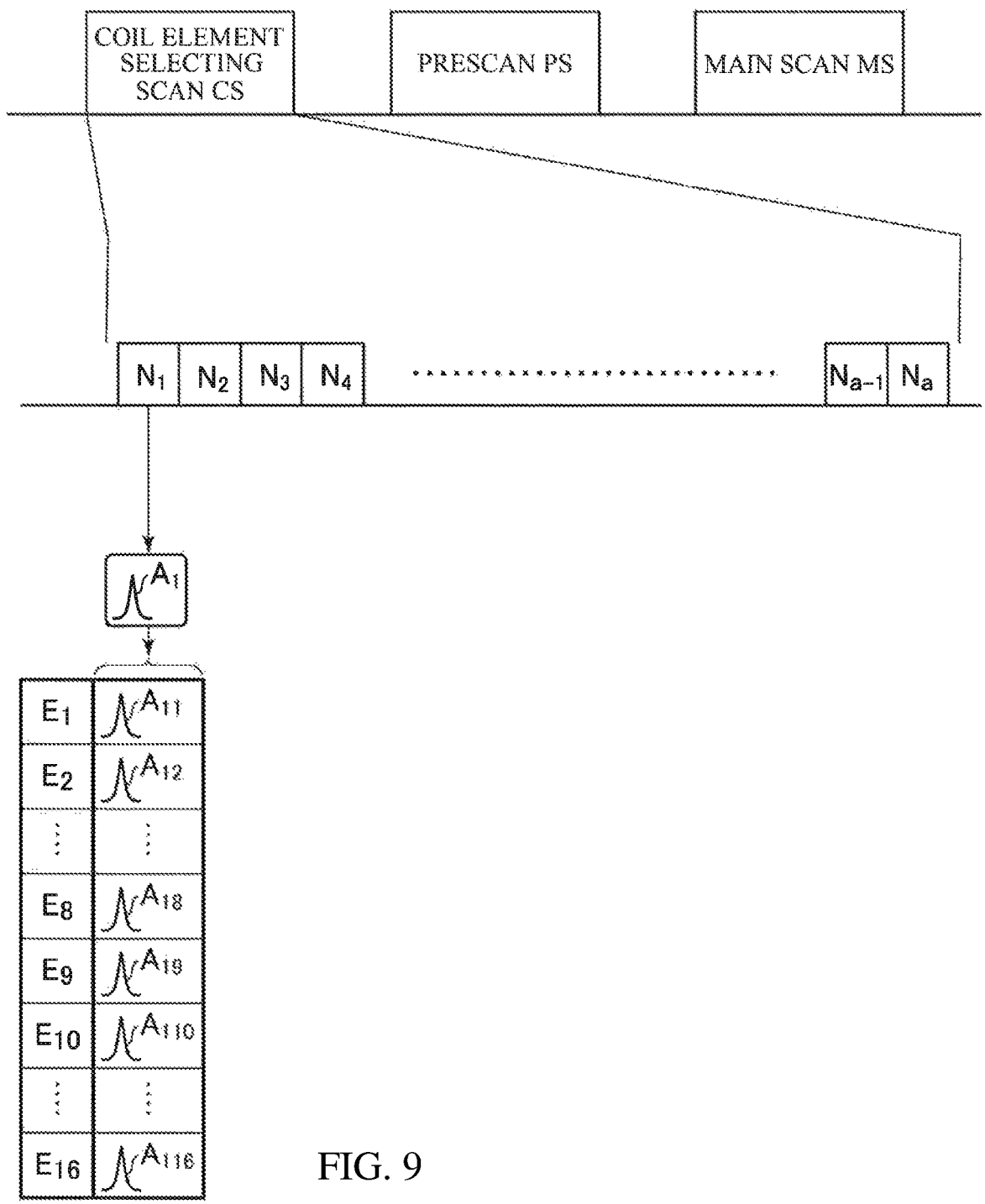
FIG. 9 is a diagram explaining the navigator sequence $N_1$.

FIG. 9 is a diagram explaining the navigator sequence $N_1$. Since the navigator sequence $N_1$ achieves excitation using the non-selective RF pulse $EX_1$ (see FIG. 6), a wide range of the body part (a torso including the liver and lungs, for example) may be excited by performing the navigator sequence $N_1$. An MR signal $A_1$ generated from the excited body part is received by the receive coil apparatus 4 (see FIG. 1).

Since the coil apparatus has sixteen coil elements $E_1$ to $E_{16}$ (see FIG. 2), the MR signal $A_1$ is received by the sixteen coil elements $E_1$ to $E_{16}$. The MR signal $A_1$ received by each of the coil elements $E_1$ to $E_{16}$ is subjected to processing such as demodulation/detection at the receiver 8 (see FIG. 1). Therefore, a navigator signal containing information in the MR signal $A_1$ (information on respiration) may be obtained for each coil element. The navigator signals obtained from the coil elements $E_1$ to $E_{16}$ are designated in FIG. 9 by symbols $A_{11}, A_{12}, \ldots, A_{116}$.

After performing the navigator sequence $N_1$, a next navigator sequence $N_2$ is performed.

Figure 10:
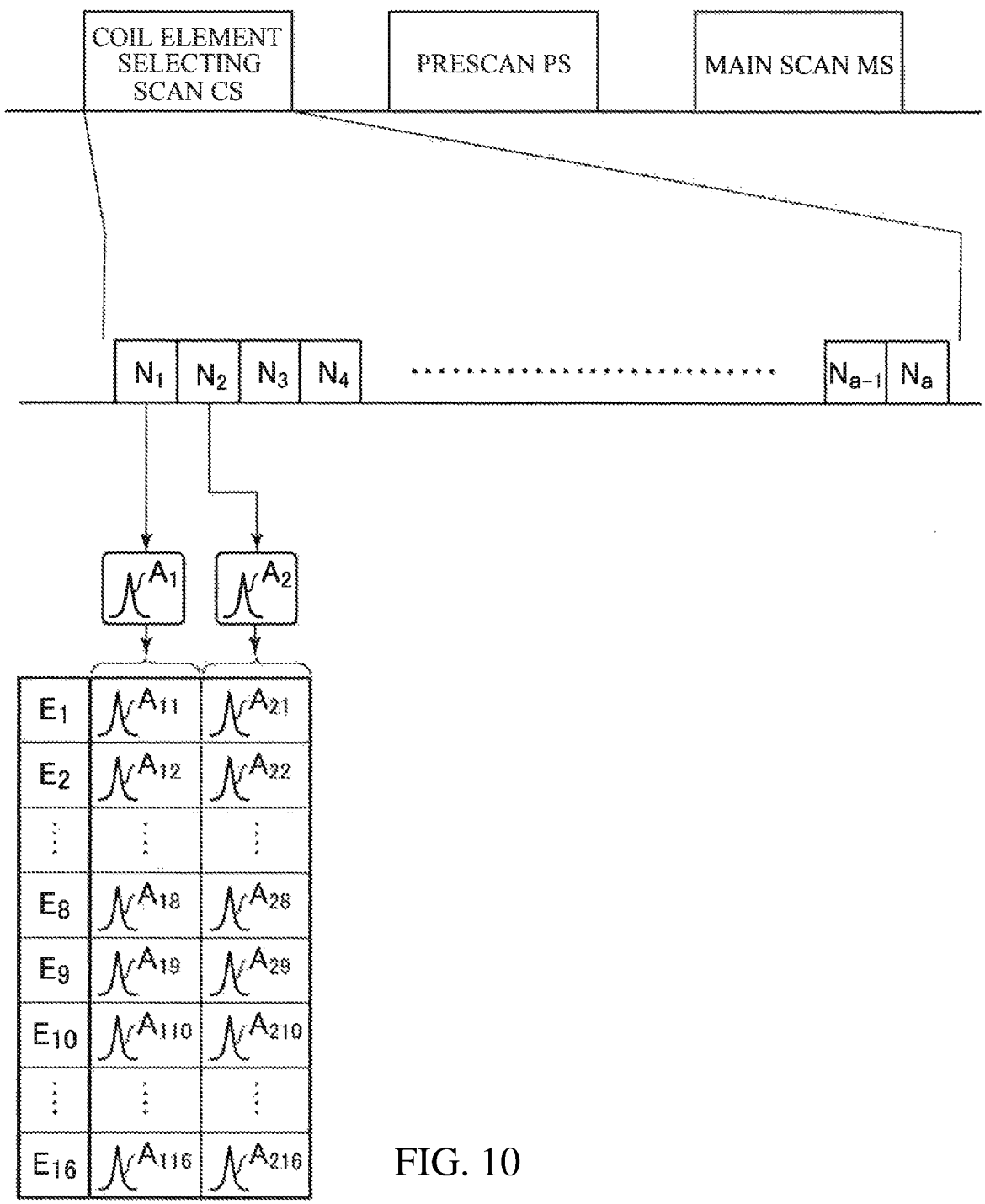
FIG. 10 is a diagram explaining the navigator sequence $N_2$.

FIG. 10 is a diagram explaining the navigator sequence $N_2$. By performing the navigator sequence $N_2$, a navigator signal containing information in an MR signal $A_2$ (information on respiration) may be obtained for each coil element. The navigator signals obtained by performing the navigator sequence $N_2$ are designated in FIG. 10 by symbols $A_{21}$, $A_{22}, \ldots, A_{216}$.

Figure 11:
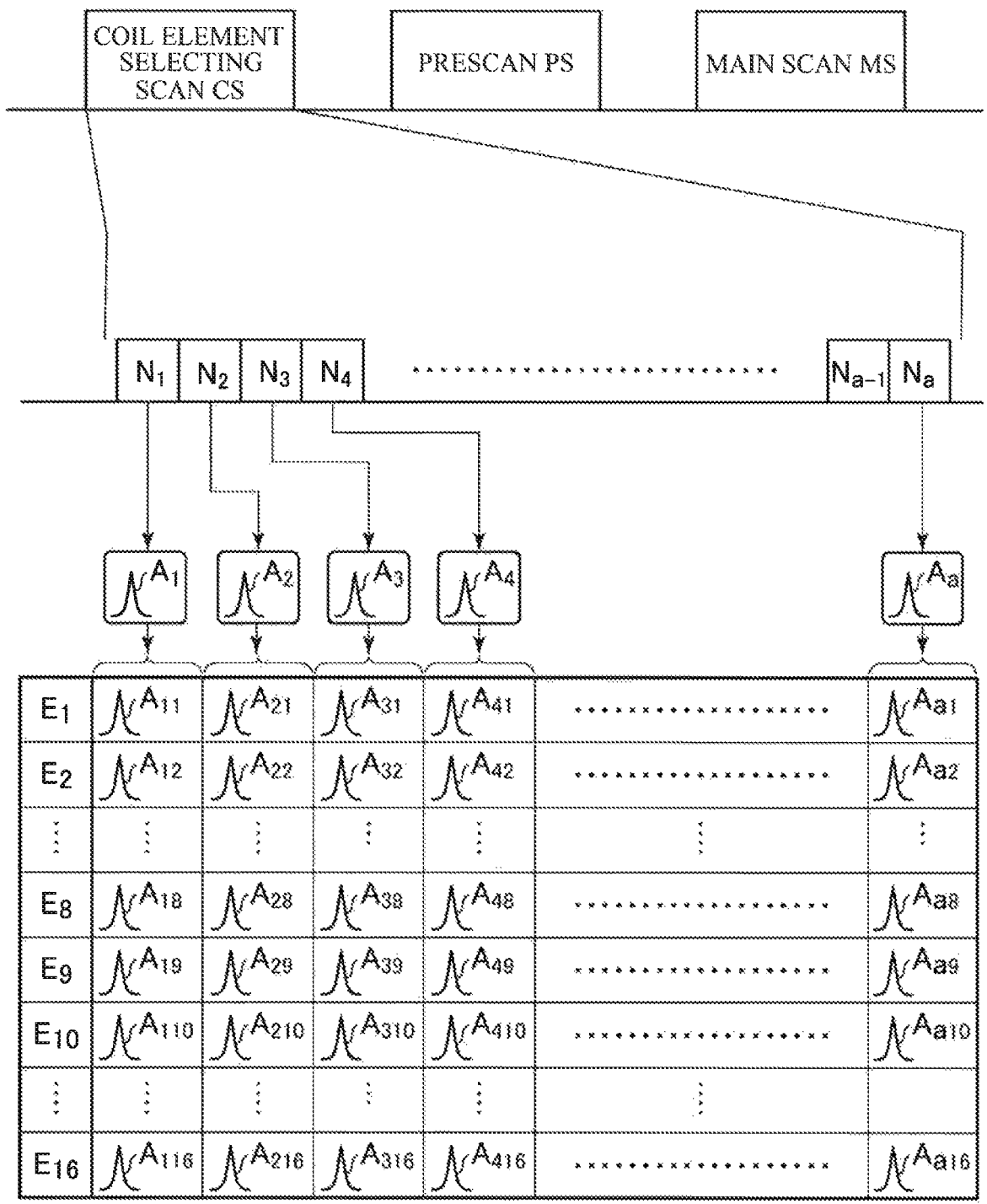
FIG. 11 is a diagram schematically showing navigator signals obtained by performing the navigator sequences $N_1$ to $N_a$.

Similarly thereafter, the navigator sequences $N_3$ to $N_a$ are performed and a navigator signal is obtained for each coil element each time a navigator sequence is performed. FIG. 11 schematically shows navigator signals obtained by performing the navigator sequences $N_1$ to $N_a$. For example, navigator signals obtained by the navigator sequence $N_a$ are designated by symbols $A_{a1}, A_{a2}, A_{a16}$. After performing the coil element selecting scan CS, the flow goes to Step ST2.

At Step ST2, processing for determining a coil element used for determining a respiration signal from among the coil elements $E_1$ to $E_{16}$ is executed. Step ST2 will be described below.

Figure 12:
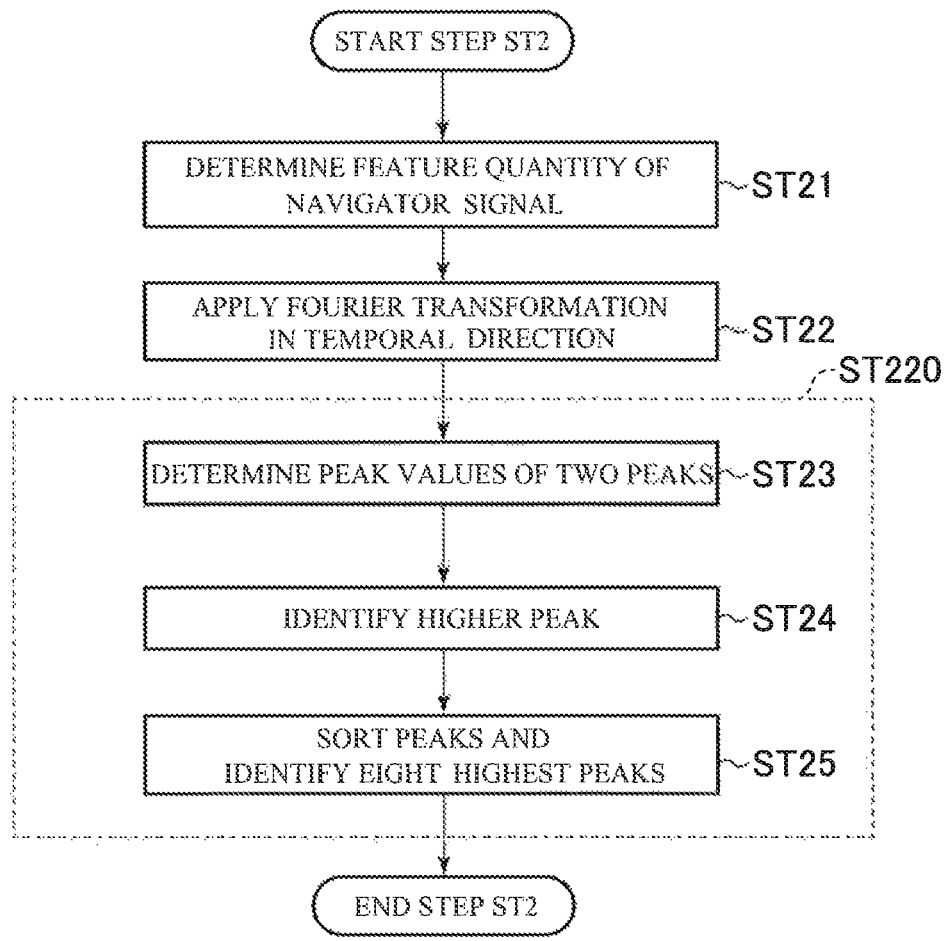
FIG. 12 is a chart showing exemplary flow of Step ST2.

FIG. 12 is a chart showing exemplary flow of Step ST2. At Step ST21, the signal analyzing unit 91 (see FIG. 4) determines a feature quantity of a navigator signal obtained for each coil element (see FIG. 13).

Figure 13:
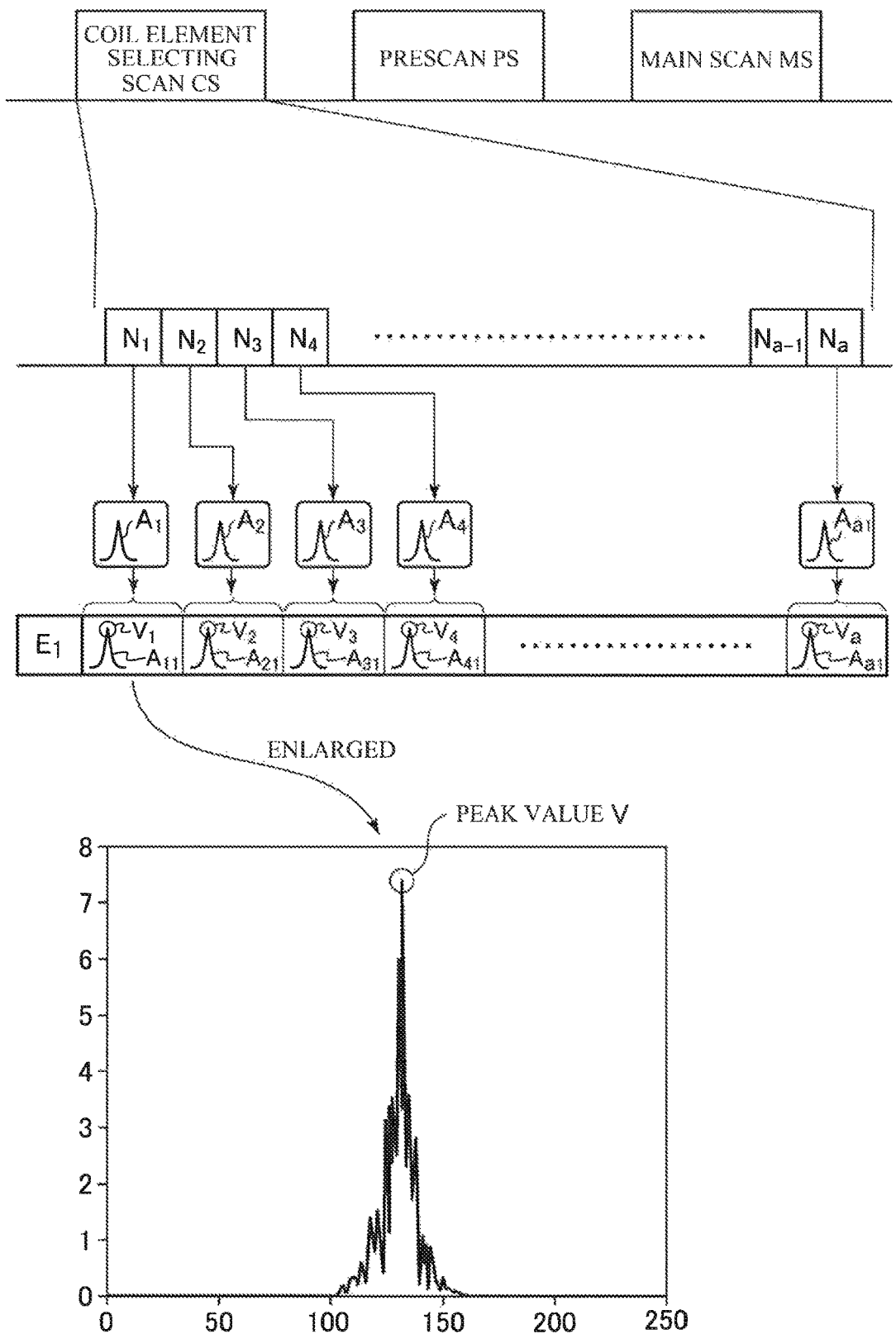
FIG. 13 is an explanatory diagram for determining a feature quantity of a navigator signal obtained for each coil element.

FIG. 13 is an explanatory diagram for determining a feature quantity of a navigator signal obtained for each coil element. It should be noted that FIG. 13 shows navigator signals $A_{11}, A_{21}, \ldots, A_{a1}$ obtained only for the coil element $E_1$ of the coil elements $E_1$ to $E_{16}$ for convenience of explanation, and those obtained for the other coil elements $E_2$ to $E_{16}$ are omitted in the drawing.

The signal analyzing unit 91 first detects a peak value of the navigator signal $A_{11}$. In FIG. 13, the navigator signal $A_{11}$ is shown enlarged. The signal value of the navigator signal is represented by its absolute value here. The peak value V of the navigator signal $A_{11}$ is determined as the feature quantity for the navigator signal $A_{11}$ in the present embodiment. After determining the feature quantity (peak value V) for the navigator signal $A_{11}$, peak values V of the other navigator signals $A_{21}$ to $A_{a1}$ are determined similarly. Thus, a peak value V is determined for each of the 'a' navigator signals $A_{11}$ to $A_{a1}$ obtained for the coil element $E_1$. In FIG. 13, subscripts "1," "2," "3," "4," . . . , "a" are added to the symbol V to distinguish the peak values for the navigator signals $A_{11}$ to $A_{a1}$.

Figure 14:
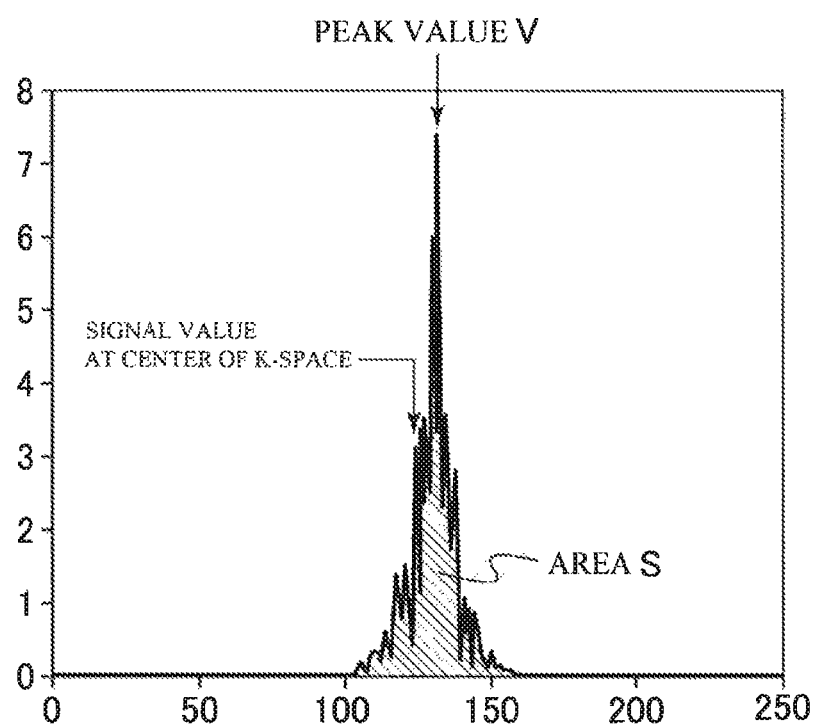
FIG. 14 is a diagram showing other examples of the feature quantity of a navigator signal.

While the peak value of a navigator signal is determined as the feature quantity for the navigator signal in the preceding description, a value other than the peak value of a navigator signal may be determined as the feature quantity for the navigator signal. FIG. 14 shows other examples of the feature quantity of a navigator signal. The other examples of the feature quantity may include, for example, a signal value of the navigator signal at the center of k-space, and the area of the navigator signal. The present embodiment assumes that the peak value of a navigator signal is determined as the feature quantity for the navigator signal.

Figure 15:
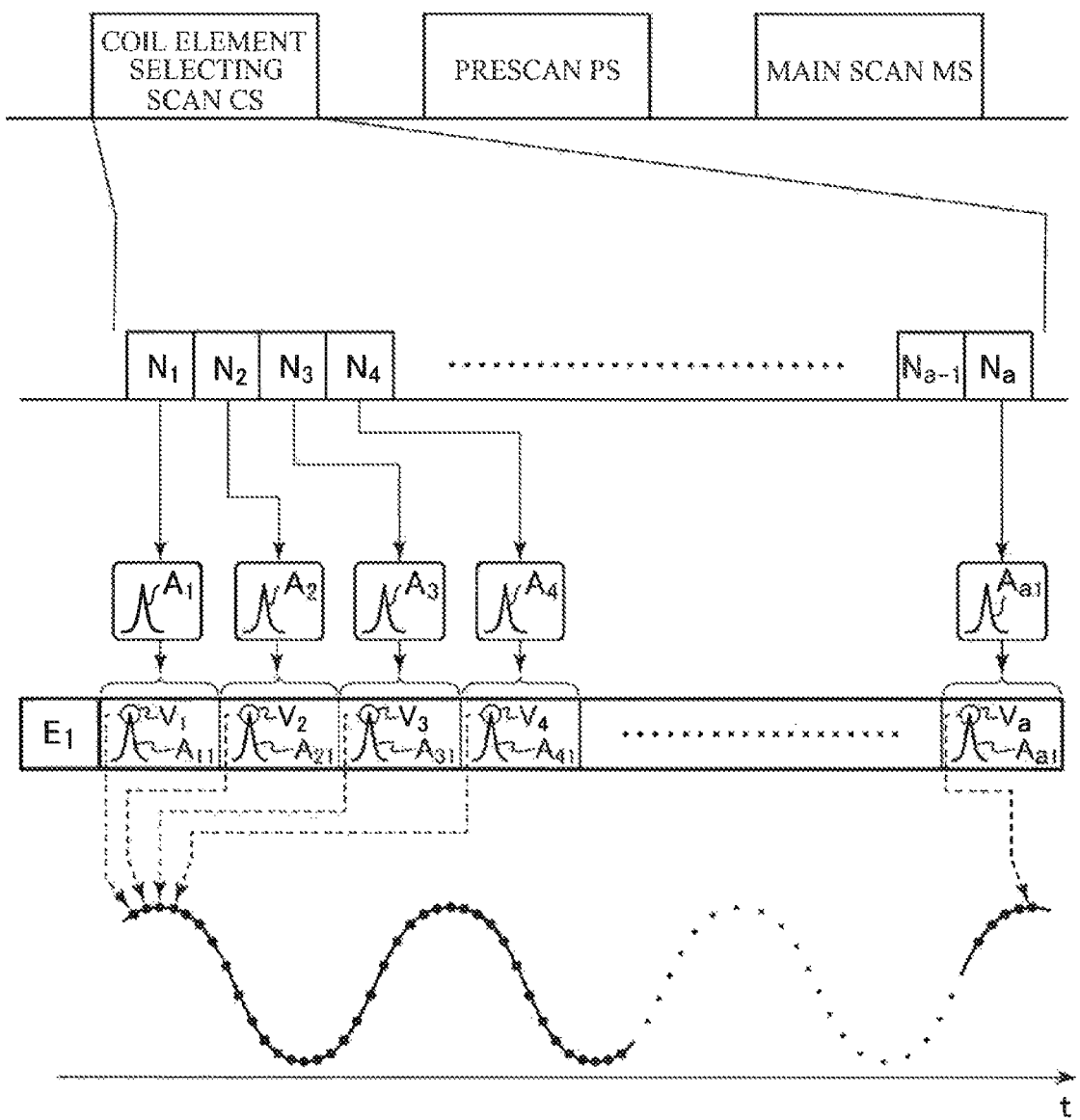
FIG. 15 is a diagram schematically showing peak-value data representing peak values $V_1$ to $V_a$ of the navigator signals arranged in time series.

FIG. 15 schematically shows peak-value data representing the peak values $V_1$ to $V_a$ of the navigator signals arranged in time series. It can be seen from FIG. 15 that the peak values $V_1$ to $V_a$ change with time. After determining the feature quantity, the flow goes to Step ST22.

Figure 16:
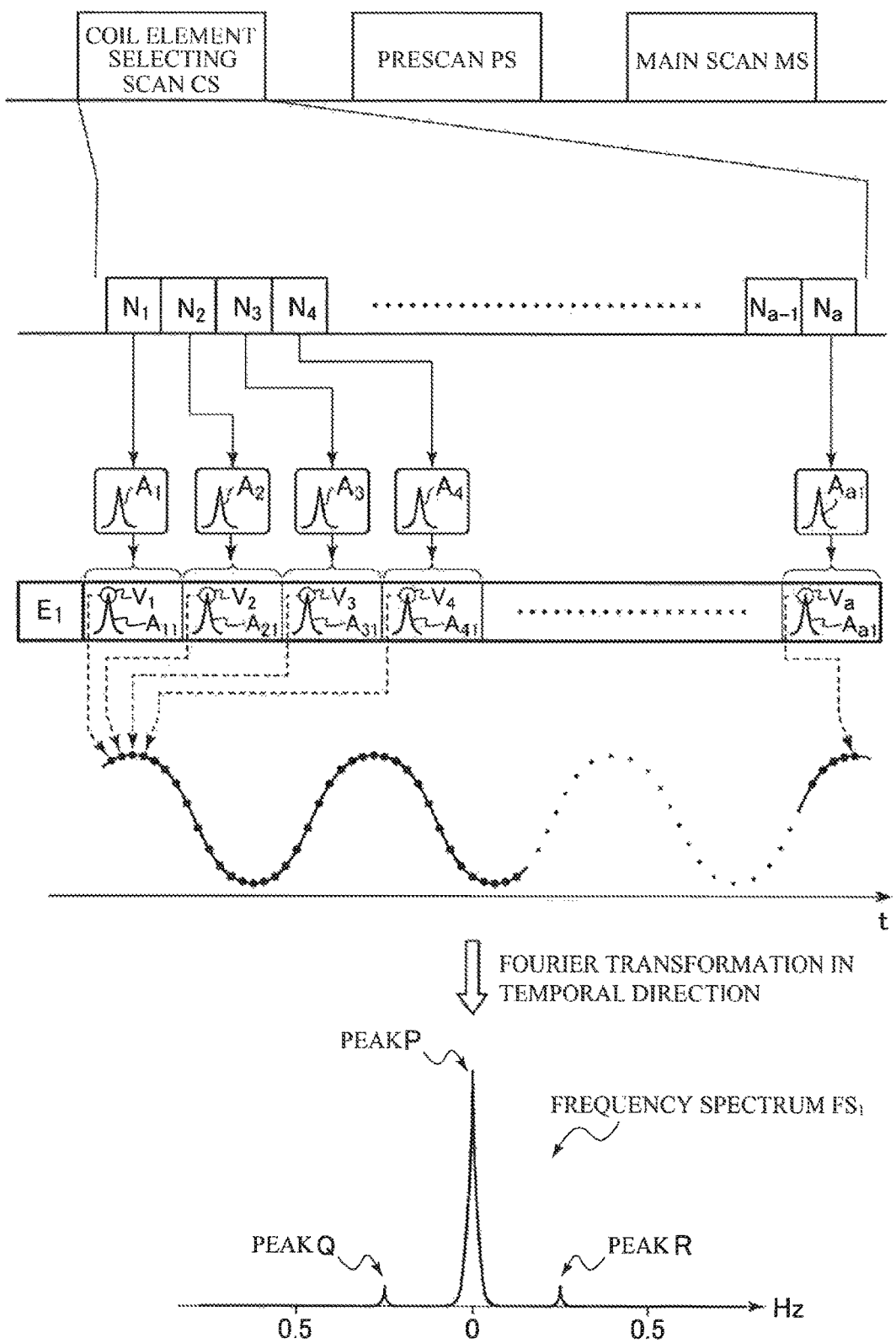
FIG. 16 is a diagram schematically showing a frequency spectrum $FS_1$ obtained by Fourier-transforming the peak-value data in a temporal direction.

At Step ST22, the transforming unit 92 (see FIG. 4) Fourier-transforms the peak value data representing the peak values $V_1$ to $V_a$ in a temporal direction. The Fourier-transformation of the peak value data in the temporal direction gives a frequency spectrum. FIG. 16 schematically shows a frequency spectrum $FS_1$ obtained by Fourier-transforming the peak value data in the temporal direction. The frequency spectrum $FS_1$ principally exhibits three peaks P, Q, and R.

The peak P is a peak appearing near 0 Hz. The peak P represents a peak from a body part experiencing no (or almost no) periodical respiration-induced motion (i.e., a peak not reflecting motion of a body part moving with respiration).

The peaks Q and R appear on the both sides of the peak P. Since the period of respiration of an average adult is a value of the order of four seconds, the frequency corresponding to respiratory motion appears near $\pm 1/T = \pm 1/4 = \pm 0.25$ (Hz), wherein the period of respiration is represented as T. It can therefore be seen that the peak appearing near $\pm 0.25$ Hz represents a peak reflecting motion of a body part moving with respiration. In FIG. 16, the peak Q appears near $-0.25$ Hz, while the peak R appears near $0.25$ Hz. Therefore, it can be seen that the peaks Q and R are peaks reflecting motion of a body part moving with respiration.

While the method of determining a frequency spectrum in the coil element $E_1$ is described in FIG. 16, those in the other coil elements $E_2$ to $E_{16}$ may be determined by a similar method. FIG. 17 schematically shows frequency spectra $FS_1$ to $FS_{16}$ respectively obtained for the coil elements.

As described above, the frequencies corresponding to subject's respiratory motion appear near $\pm 0.25$ Hz. Therefore, it can be seen that the frequency component from respiratory motion is higher for a larger peak appearing near $\pm 0.25$ Hz. Thus, by analyzing the frequency spectra $FS_1$ to $FS_{16}$, it is possible to identify a coil element from which a frequency spectrum fully reflecting respiratory motion may be obtained. To decide whether or not a frequency spectrum obtained for each coil element fully reflects respiratory motion, the flow goes to Step ST220.

At Step ST220, the selecting unit 93 (see FIG. 4) selects a coil element for determining a signal value of a subject's respiration signal from among a plurality of coil elements based on the frequency spectrum. Now Step ST220 will be described below. Step ST220 has Steps ST23, ST24, and ST25, which will be described one by one.

FIG. 18 is a diagram explaining Step ST23. At Step ST23, the selecting unit 93 determines peak values (absolute values) of the peaks Q and R appearing near ±0.25 Hz for each frequency spectrum. In FIG. 18, the peak values of the peaks Q and R are indicated within parentheses. For example, for a frequency spectrum $FS_3$, the peak value of the peak Q is indicated as "$q_3$," and that of the peak R as "$r_3$." After determining the peak values of the peaks Q and R, the flow goes to Step ST24.

At Step ST24, the selecting unit 93 identifies a higher one of the two peaks obtained for each frequency spectrum. FIG. 19 shows higher peaks. For example, in the frequency spectrum $FS_3$, the peak Q ($q_3$) of the two peaks Q ($q_3$) and R ($r_3$) is identified as a higher peak. After identifying a higher peak for each frequency spectrum, the flow goes to Step ST25.

At Step ST25, the selecting unit 93 sorts the higher peaks respectively identified for the frequency spectra in a descending order of the peak value to identify eight highest peaks. Therefore, eight highest-ranked coil elements reflecting respiration-induced motion may be identified from among the sixteen coil elements $E_1$ to $E_{16}$. The selecting unit 93 selects the thus-identified eight coil elements as coil elements that have successfully received an MR signal fully reflecting respiratory motion. FIG. 20 shows exemplary eight selected coil elements. It is assumed here that the coil elements $E_3$, $E_4$, $E_5$, $E_6$, $E_{11}$, $E_{12}$, $E_{13}$, and $E_{14}$ are selected. Once the coil elements have been selected, Step ST2 is completed.

While the above-described case involves comparing peak values of peaks in the frequency spectra $FS_1$ to $FS_{16}$ with one another to select a coil element(s), a method of selecting a coil element(s) is not limited to that described above. An example of selecting a coil element(s) by a method different from the above one will be described below.

Figure 21:
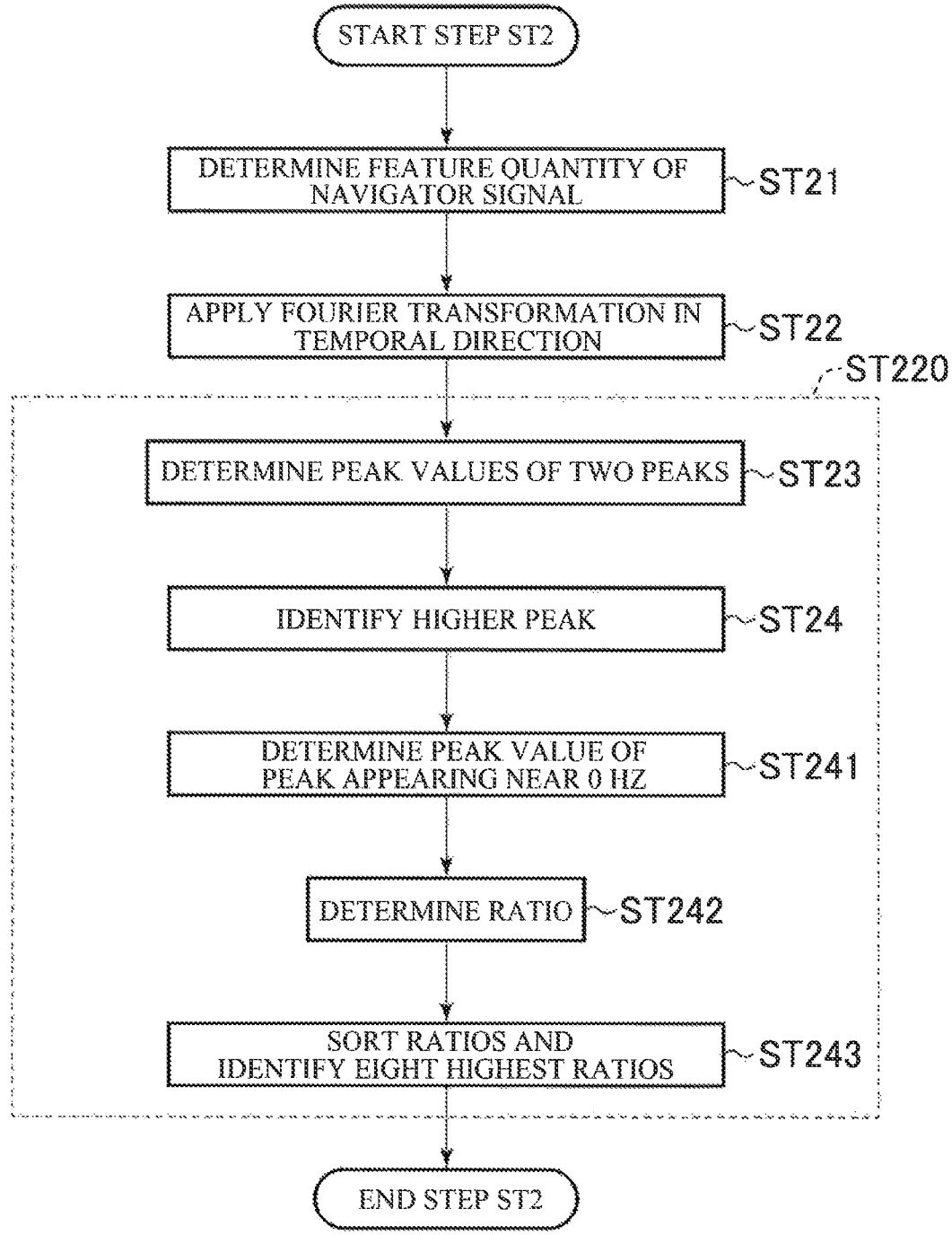
FIG. 21 is a chart showing the other flow of Step ST2 for selecting coil elements.

FIG. 21 is a chart showing the other flow of Step ST2 for selecting a coil element. Since Steps ST21 to ST24 in FIG. 21 are identical to those in FIG. 12, explanation thereof will be omitted. After identifying higher peaks (see FIG. 19), the flow goes to Step ST241.

At Step ST241, the selecting unit 93 determines a peak value (absolute value) of the peak P appearing near 0 Hz for each frequency spectrum. In FIG. 22, the peak value of the peak P is indicated within parentheses. For example, for the frequency spectrum $FS_3$, the peak value of the peak P is indicated as "$p_3$." After determining the peak value of the peak P appearing near 0 Hz for each frequency spectrum, the flow goes to Step ST242.

At Step ST242, the selecting unit 93 determines a ratio H between the peak value of the higher peak identified at Step ST24 and that of the peak appearing near 0 Hz for each frequency spectrum. FIG. 23 shows the ratio H determined for each frequency spectrum. For the coil element $E_3$, for example, the peak Q ($q_3$) is identified as the higher peak at Step ST24. Therefore, the ratio H for the coil element $E_3$ is $H=q_3/p_3$.

A greater ratio H means that the peak value of the peak appearing near 0.25 Hz or −0.25 Hz (i.e., a peak from the body part experiencing respiration-induced motion) is high relative to the peak value of the peak P appearing near 0 Hz (i.e., a peak from the body part experiencing no respiration-induced motion). It can therefore be seen that respiration-induced motion is reflected more for the greater ratio H. After calculating the ratio H, the flow goes to Step ST243.

At Step ST243, the selecting unit 93 sorts the ratios H respectively calculated for the frequency spectra in a descending order to identify eight highest ratios H. Therefore, eight highest-ranked coil elements reflecting respiration-induced motion may be identified from among the sixteen coil elements $E_1$ to $E_{16}$. The selecting unit 93 selects the thus-identified eight coil elements as coil elements that have successfully received an MR signal fully reflecting respiratory motion. FIG. 24 shows exemplary eight selected coil elements. It is assumed here that the coil elements $E_3$, $E_4$, $E_5$, $E_6$, $E_{11}$, $E_{12}$, $E_{13}$, and $E_{14}$ are selected, as in FIG. 21. Once the coil elements have been selected, Step ST2 is completed. Thus, the ratio H may be used to select coil elements. The ratio H represents a ratio between the peak value of the peak Q (or R) from a body part experiencing respiration-induced motion and that of the peak P from a body part experiencing (substantially) no respiration-induced motion. Therefore, by using the ratio H, coil elements in which an effect of the body part moving with respiration is reflected as much as possible and in which an effect of the body part experiencing (substantially) no respiration-induced motion is unreflected as much as possible may be selected from among the sixteen coil elements, which makes it possible to select coil elements more suitable for generation of a respiration signal.

As described above, coil elements that have successfully received an MR signal fully reflecting respiratory motion can be selected by performing the flow in FIG. 12 or 21. It is assumed here that the eight coil elements $E_3$, $E_4$, $E_5$, $E_6$, $E_{11}$, $E_{12}$, $E_{13}$, and $E_{14}$ are selected. After selecting the coil elements, the flow goes to Step ST3 (see FIG. 8).

At Step ST3, the prescan PS is performed. Now the prescan PS will be described below.

Figure 25:
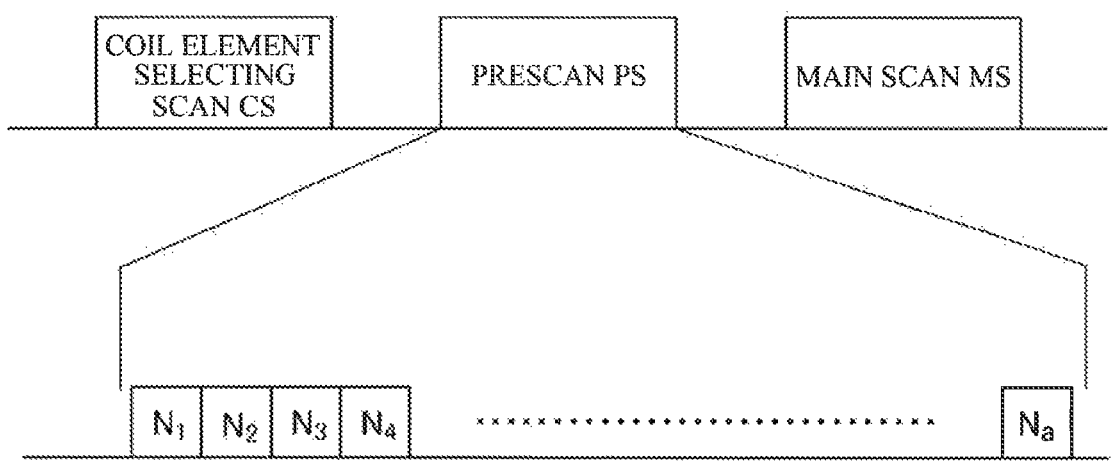
FIG. 25 is a diagram explaining sequences performed in the prescan PS.

FIG. 25 is a diagram explaining sequences performed in the prescan PS. In the prescan PS, navigator sequences $N_1$ to $N_a$ are sequentially performed, as in the coil element selecting scan CS.

Figure 26:
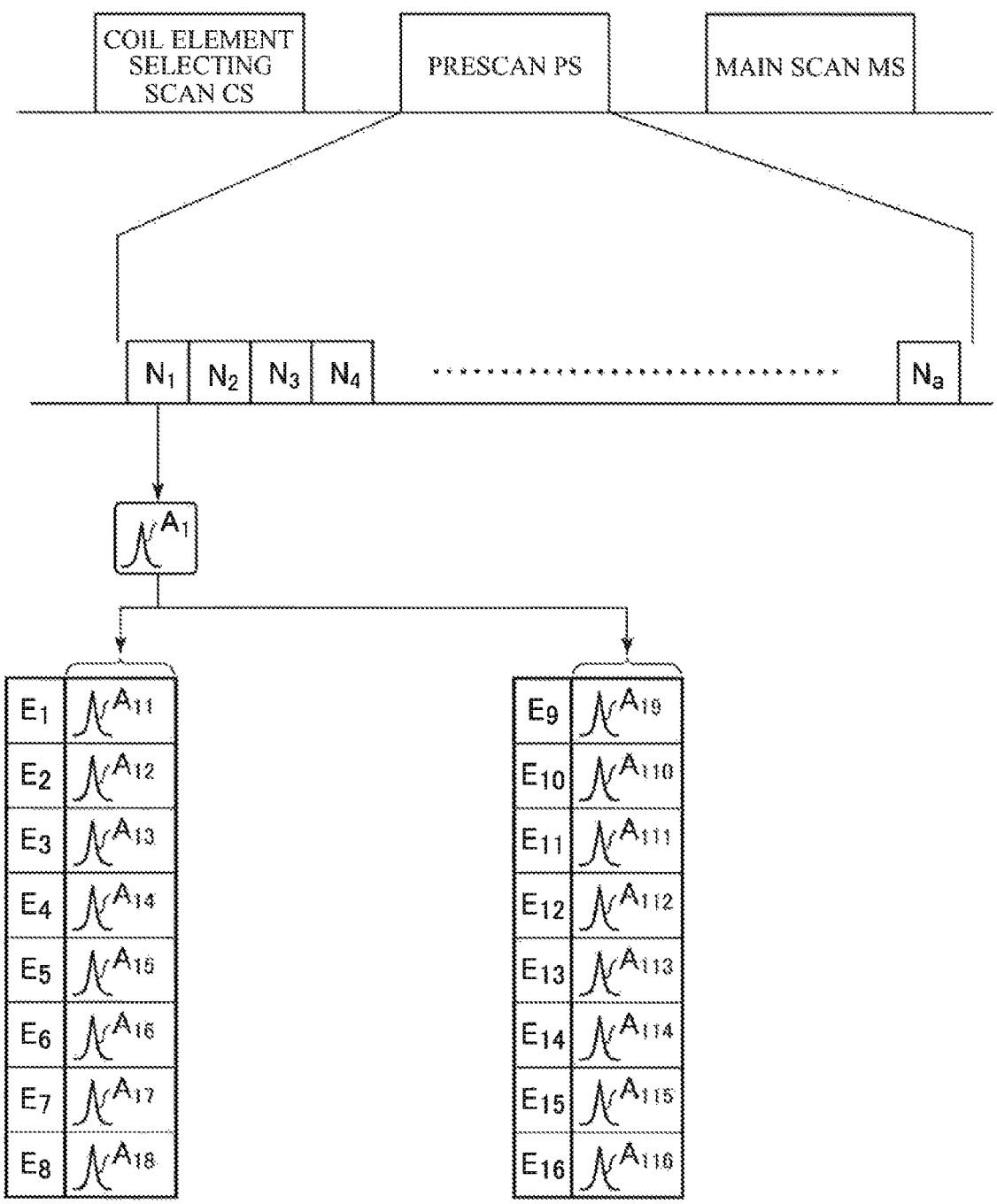
FIG. 26 is a diagram explaining the navigator sequence $N_1$ performed in the prescan PS.

FIG. 26 is a diagram explaining the navigator sequence $N_1$ performed in the prescan PS. Since the navigator sequence Nu achieves excitation using the non-selective RF pulse $EX_1$ (see FIG. 6), a wide range of the body part (a torso including the liver and lungs, for example) may be excited by performing the navigator sequence $N_1$. An MR signal $A_1$ generated from the excited body part is received by the receive coil apparatus 4 (see FIG. 1).

Since the receive coil apparatus 4 has coil elements $E_1$ to $E_{16}$, the MR signal $A_1$ is received by each of the coil elements $E_1$ to $E_{16}$. The signals received by the coil elements $E_1$ to $E_{16}$ are transmitted to the receiver 8. The receiver 8 applies signal processing such as demodulation/detection to the signals received from the coil elements. Therefore, by performing the navigator sequence $N_1$, a navigator signal containing information in the MR signal $A_1$ (information on respiration) may be obtained for each coil element. The navigator signals are schematically shown here with symbols $A_{11}, A_{12}, A_{13}, \ldots, A_{116}$.

Figure 27:
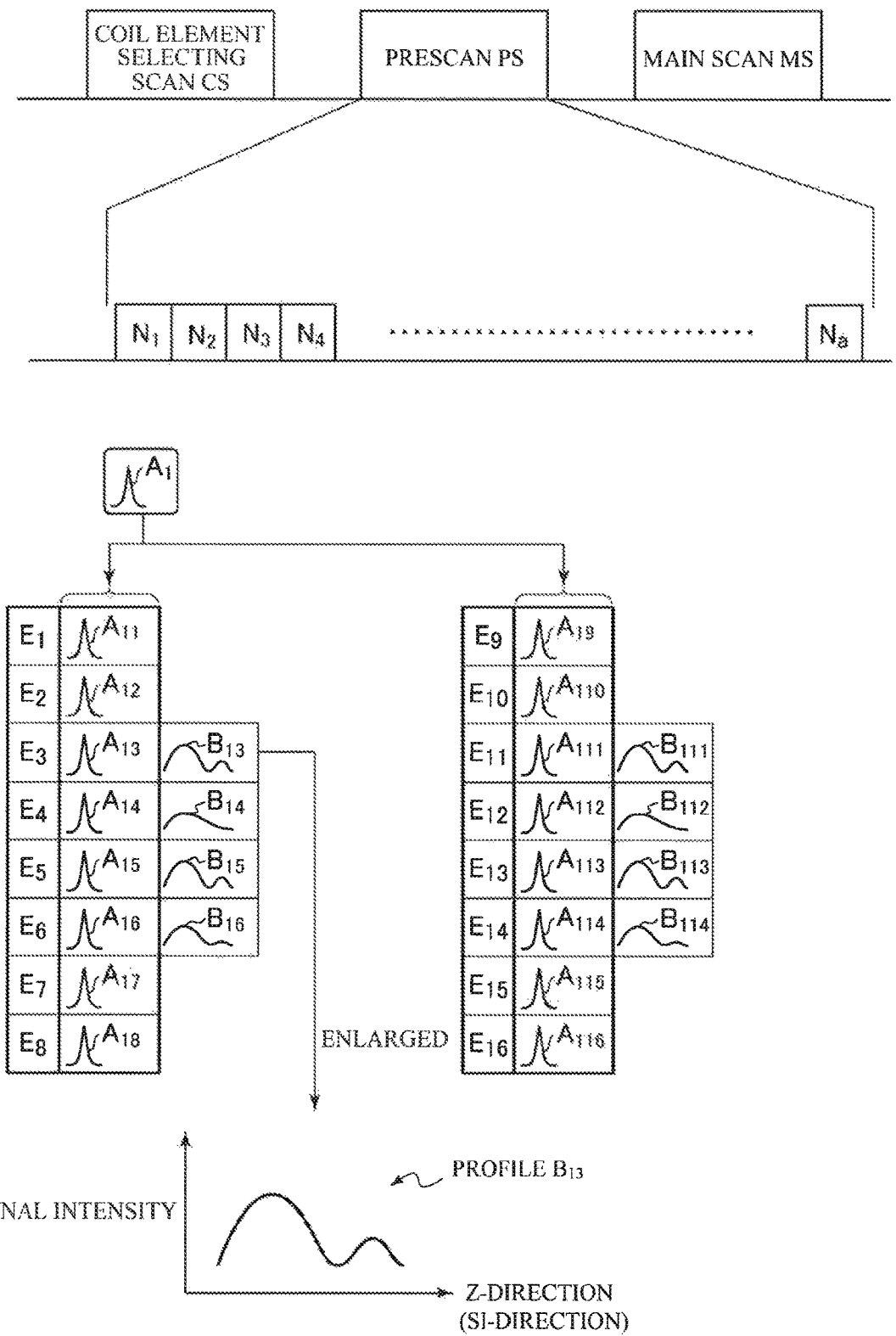
FIG. 27 is a diagram showing a profile obtained by Fourier transformation.

After obtaining the navigator signals $A_{11}$ to $A_{116}$, the producing unit 94 (see FIG. 4) Fourier-transforms the navigator signals obtained by the coil elements selected at Step ST2 in the z-direction (SI-direction) to generate profiles. FIG. 27 schematically shows the profiles obtained by Fourier transformation.

In the present embodiment, eight coil elements $E_3$, $E_4$, $E_5$, $E_6$, $E_{11}$, $E_{12}$, $E_{13}$, and $E_{14}$ are selected at Step ST2. Therefore, the producing unit 94 Fourier-transforms navigator signals $A_{13}$, $A_{14}$, $A_{15}$, $A_{16}$, $A_{111}$, $A_{112}$, $A_{113}$, and $A_{114}$ obtained by the eight coil elements $E_3$, $E_4$, $E_5$, $E_6$, $E_{11}$, $E_{12}$, $E_{13}$, and $E_{14}$. The profiles obtained by Fourier-transforming the navigator signals $A_{13}$, $A_{14}$, $A_{15}$, $A_{16}$, $A_{111}$, $A_{112}$, $A_{113}$, and $A_{114}$ are indicated by symbols $B_{13}$, $B_{14}$, $B_{15}$, $B_{16}$, $B_{111}$, $B_{112}$, $B_{113}$, and $B_{114}$ in FIG. 27. In FIG. 27, moreover, a representative profile $B_{13}$ from among the profile $B_{13}$ to $B_{114}$ is schematically shown enlarged. The profile expresses a relationship between a position in the z-direction (SI-direction) and a signal intensity at the position.

After determining the profiles $B_{13}$ to $B_{114}$, the combining unit 95 (see FIG. 4) combines these profiles $B_{13}$ to $B_{114}$ together.

Figure 28:
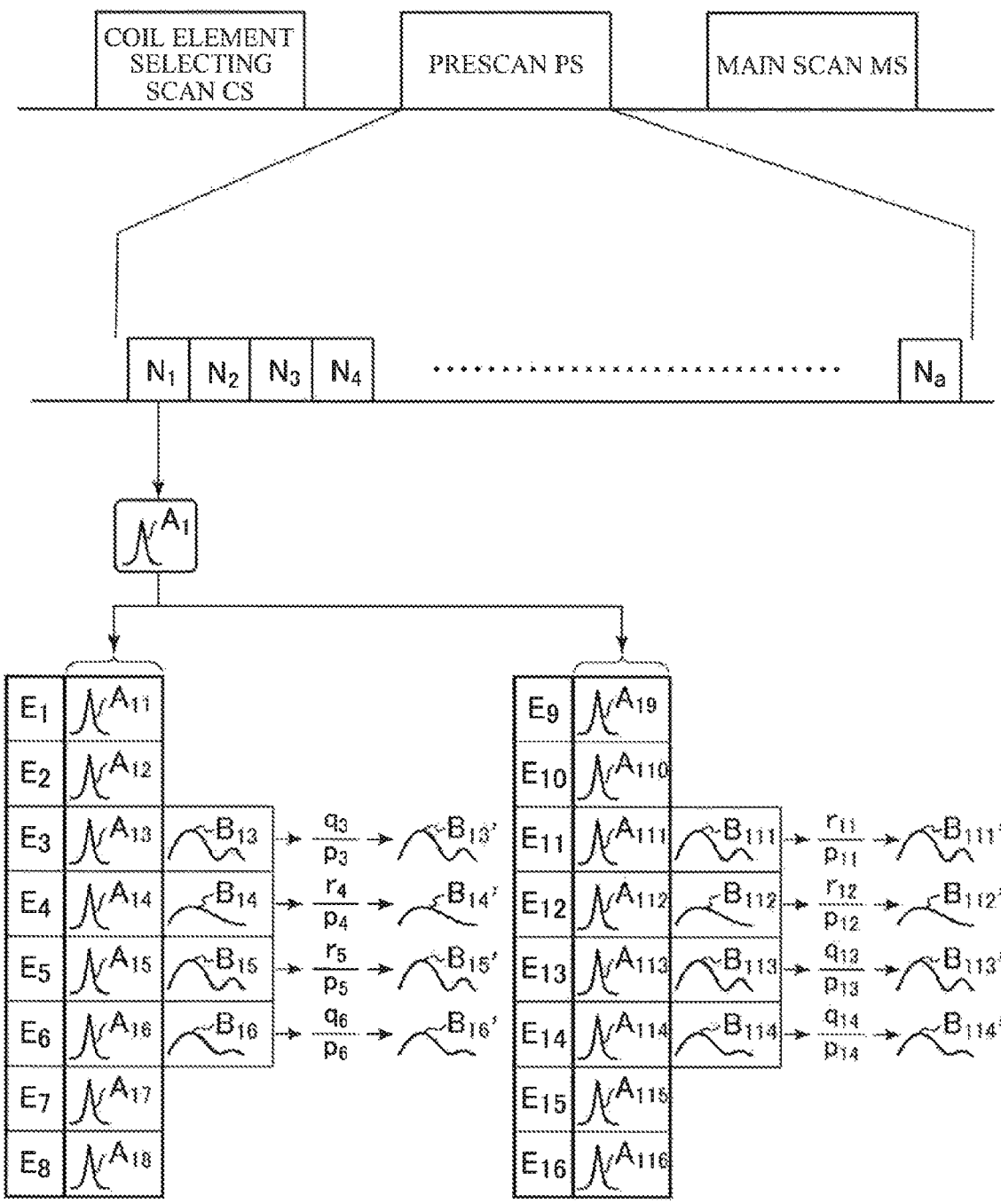
FIG. 28 is a diagram explaining weighting on the profiles $B_{13}$ to $B_{114}$.
Figure 29:
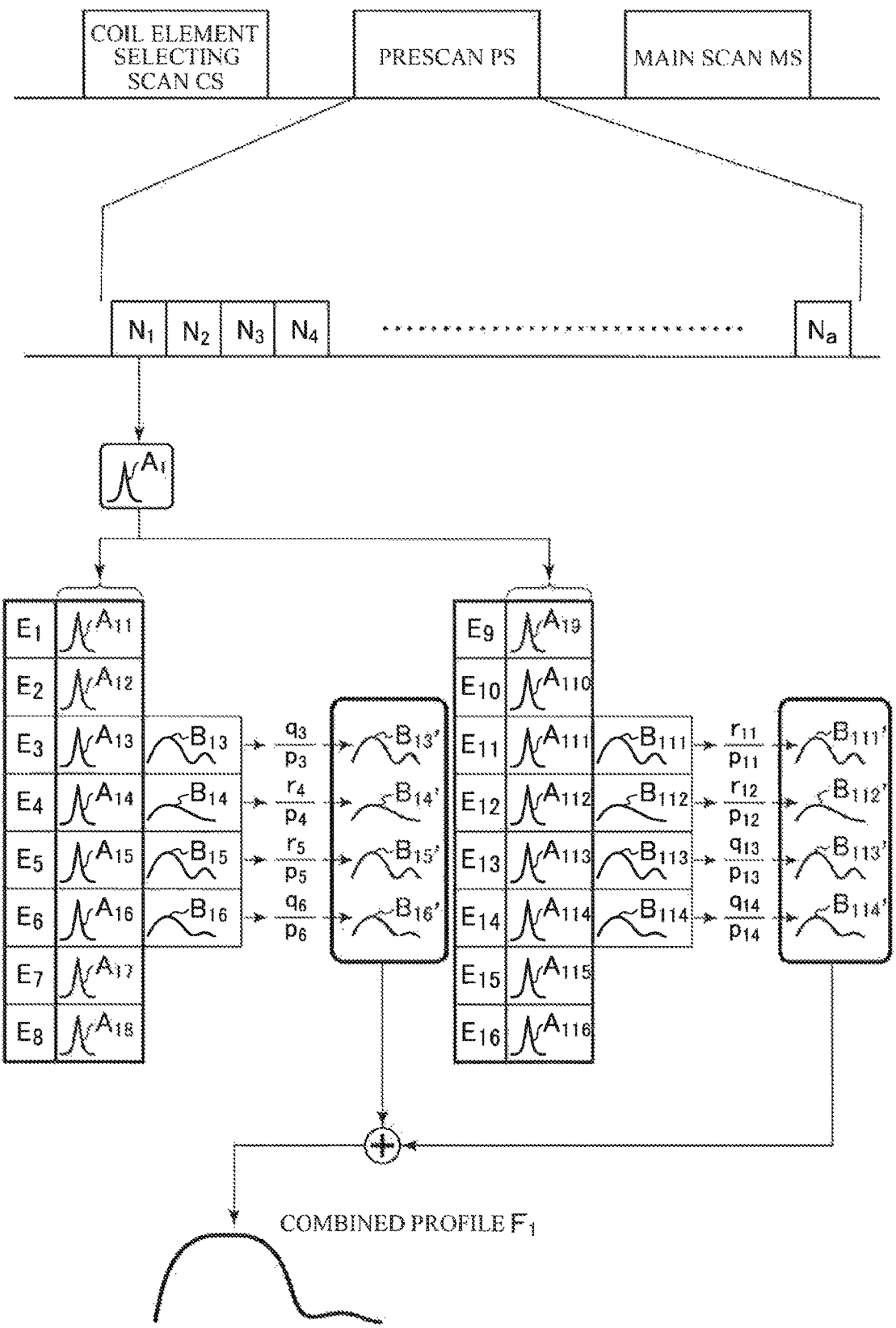
FIG. 29 is a diagram explaining addition of the weighted profiles.

FIGS. 28 and 29 are diagrams explaining a method of combination. The combining unit 95 first applies weighting to the profiles $B_{13}$ to $B_{114}$ (see FIG. 28).

FIG. 28 is a diagram explaining weighting on the profiles $B_{13}$ to $B_{114}$. The combining unit 95 applies weighting to a profile based on the ratio H (see FIG. 23) determined when the coil element selecting scan CS is performed.

For example, focusing upon the coil element $E_3$, the ratio H determined for the coil element $E_3$ is $H=q_3/p_3$. Therefore, the combining unit 95 applies weighting to the profile $B_{13}$ with $H=q_3/p_3$. In the present embodiment, weighting is applied to the profile $B_{13}$ by multiplying the profile $B_{13}$ by $H=q_3/p_3$. FIG. 28 indicates the profile $B_{13}$ weighted by $H=q_3/p_3$ as a symbol "$B_{13}'$."

Similarly thereafter, the combining unit 95 applies weighting to the profiles obtained by the other selected coil elements $E_4$, $E_5$, $E_6$, $E_{11}$, $E_{12}$, $E_{13}$, and $E_{14}$ by the ratios H respectively determined for the other coil elements. A weighted profile may thus be calculated for each selected coil element. In FIG. 28, the weighted profiles are indicated by symbols "$B_{13}'$," "$B_{14}'$," "$B_{15}'$," "$B_{16}'$," "$B_{111}'$," "$B_{112}'$," "$B_{113}'$," and "$B_{114}'$."

After weighting the profiles, the combining unit 95 adds the weighted profiles $B_{13}'$ to $B_{114}'$ together. FIG. 29 is a diagram explaining addition of the weighted profiles. The addition of the weighted profiles $B_{13}'$ to $B_{114}'$ together generates a combined profile $F_1$.

Figure 30:
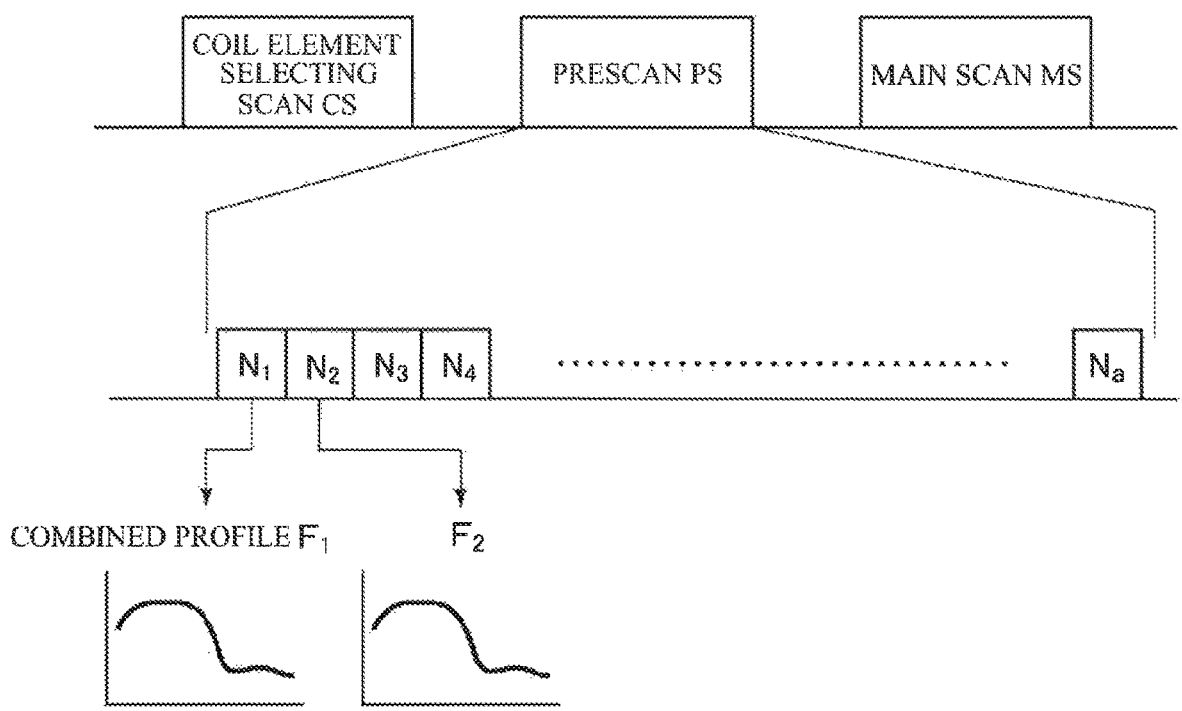
FIG. 30 is a diagram schematically showing combined profiles $F_1$ and $F_2$.

After performing the navigator sequence $N_1$, a next navigator sequence $N_2$ is performed. When the navigator sequence $N_2$ is performed, again, navigator signals obtained by the selected coil elements are Fourier-transformed in the z-direction to provide profiles. Then, a similar method to that described referring to FIGS. 28 and 29 is used to combine the profiles together. Therefore, by performing the navigator sequence $N_2$, a combined profile is obtained. FIG. 30 schematically shows a combined profile $F_1$ obtained by performing the navigator data $N_1$ and a combined profile $F_2$ obtained by performing the navigator data $N_2$.

Next, the calculating unit 96 (see FIG. 4) calculates a signal value of a respiration signal based on the combined profiles $F_1$ and $F_2$. Now a method of calculating a signal value of a respiration signal will be described below.

Figure 31:
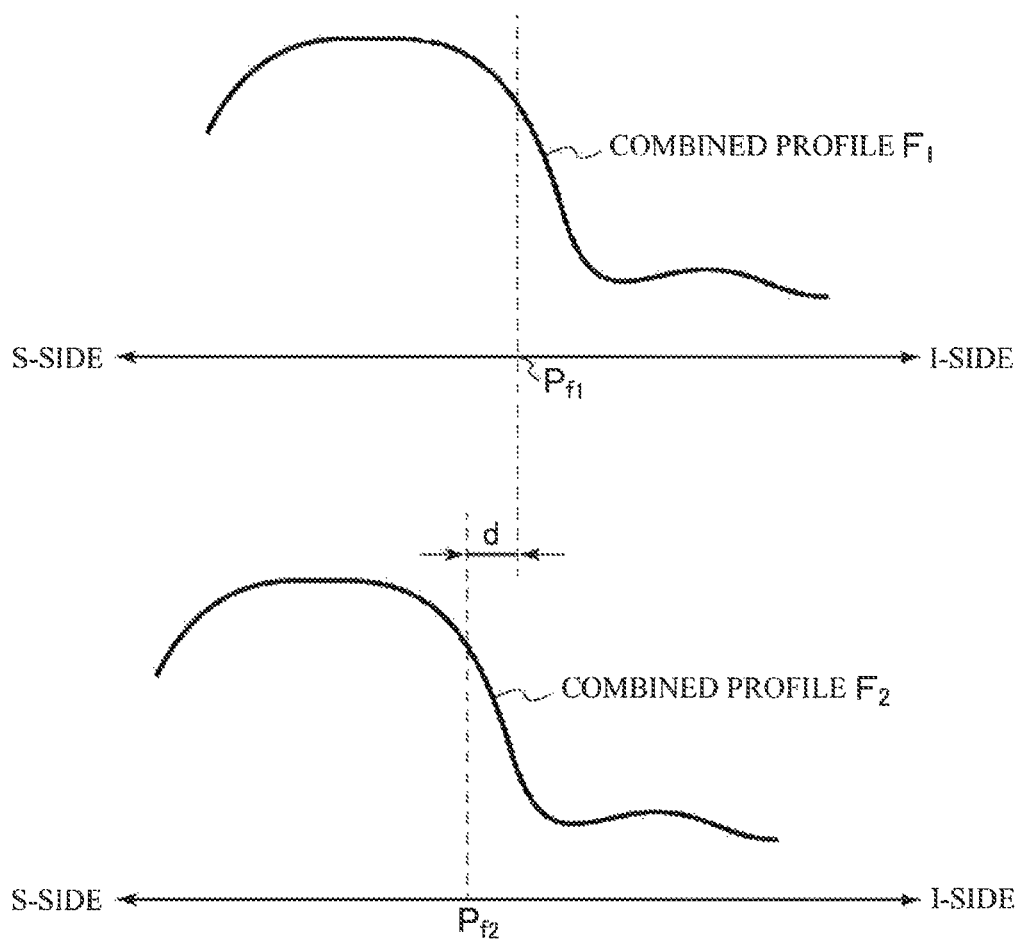
FIG. 31 is an explanatory diagram for calculating a signal value of a respiration signal based on the combined profiles $F_1$ and $F_2$.

FIG. 31 is an explanatory diagram for calculating a signal value of a respiration signal based on the combined profiles $F_1$ and $F_2$. FIG. 31 shows on its upper side the combined profile $F_1$ obtained by performing the navigator sequence $N_1$, and on its lower side the combined profile $F_2$ obtained by performing the navigator sequence $N_2$.

Figure 32:
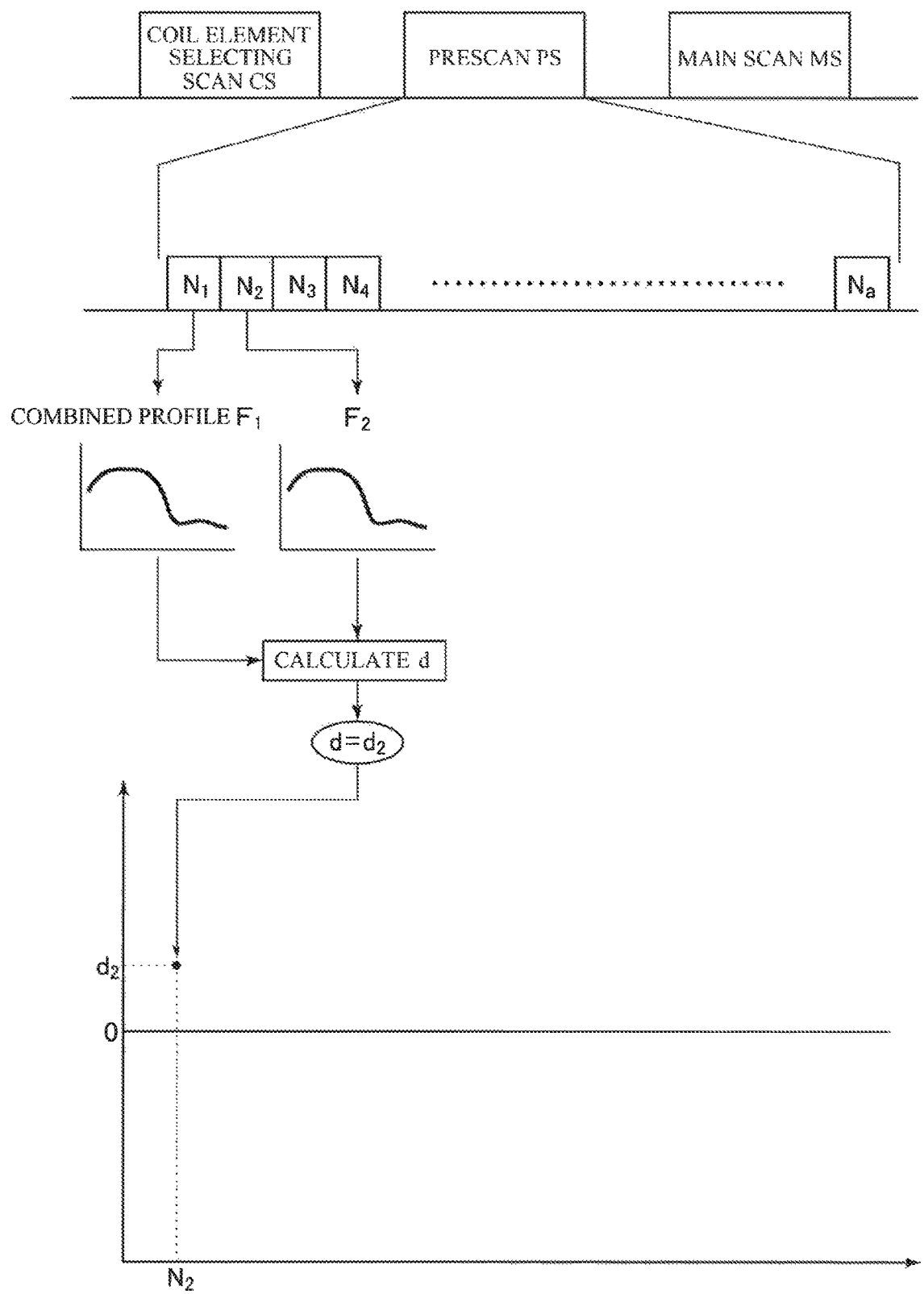
FIG. 32 is a diagram showing the amount of shift d=d2 for the combined profile $F_2$ when a squared error SE is minimized.

In the period after the navigator sequence $N_1$ is performed and before the navigator sequence $N_2$ is performed, an edge of the liver adjacent to the lungs moves. The movement of the edge of the liver thus creates a positional offset d between a rise position $P_{f1}$ in the combined profile $F_1$ and a rise position $P_{f2}$ in the combined profile $F_2$. The positional offset d may be regarded as an amount of shift of the edge of the liver in the SI-direction, and accordingly, the amount of shift of the edge of the liver may be determined by calculating d. Methods that may be used for calculating d include a method of LSQ (Least Squares), for example. According to the method of LSQ, the combined profile $F_2$ is moved in the SI-direction stepwise by $\Delta d$, and each time the combined profile $F_2$ is moved by $\Delta d$, a squared error SE between the combined profiles $F_1$ and $F_2$ is calculated. Since a smaller squared error SE implies a smaller offset of the combined profile $F_2$ relative to the combined profile $F_1$ in the SI-direction, the amount of shift of the combined profile $F_2$ when the squared error SE is minimized may be determined as the amount of shift of the edge of the liver adjacent to the lungs. FIG. 32 shows the amount of shift $d=d_2$ of the combined profile $F_2$ when the squared error SE is minimized In FIG. 32, $d=0$ represents the rise position $P_{f1}$ in the combined profile $F_1$ of the navigator sequence $N_1$. It can thus be seen that the edge of the liver adjacent to the lungs has moved by $d_2$ with respect to $d=0$ while the navigator sequence $N_2$ is performed.

Figure 33:
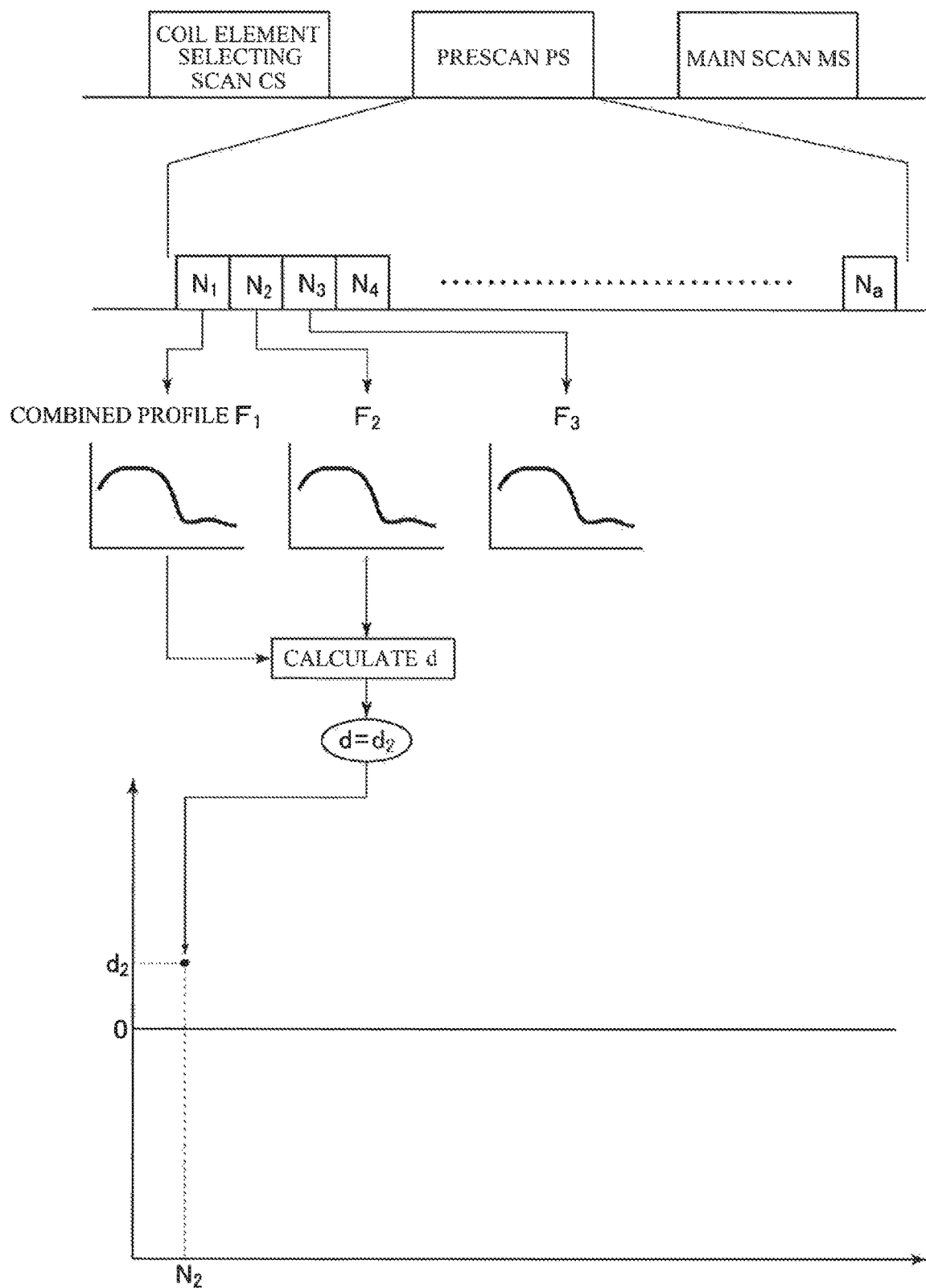
FIG. 33 is a diagram showing a combined profile $F_3$ obtained by performing the navigator sequence $N_3$.
Figure 34:
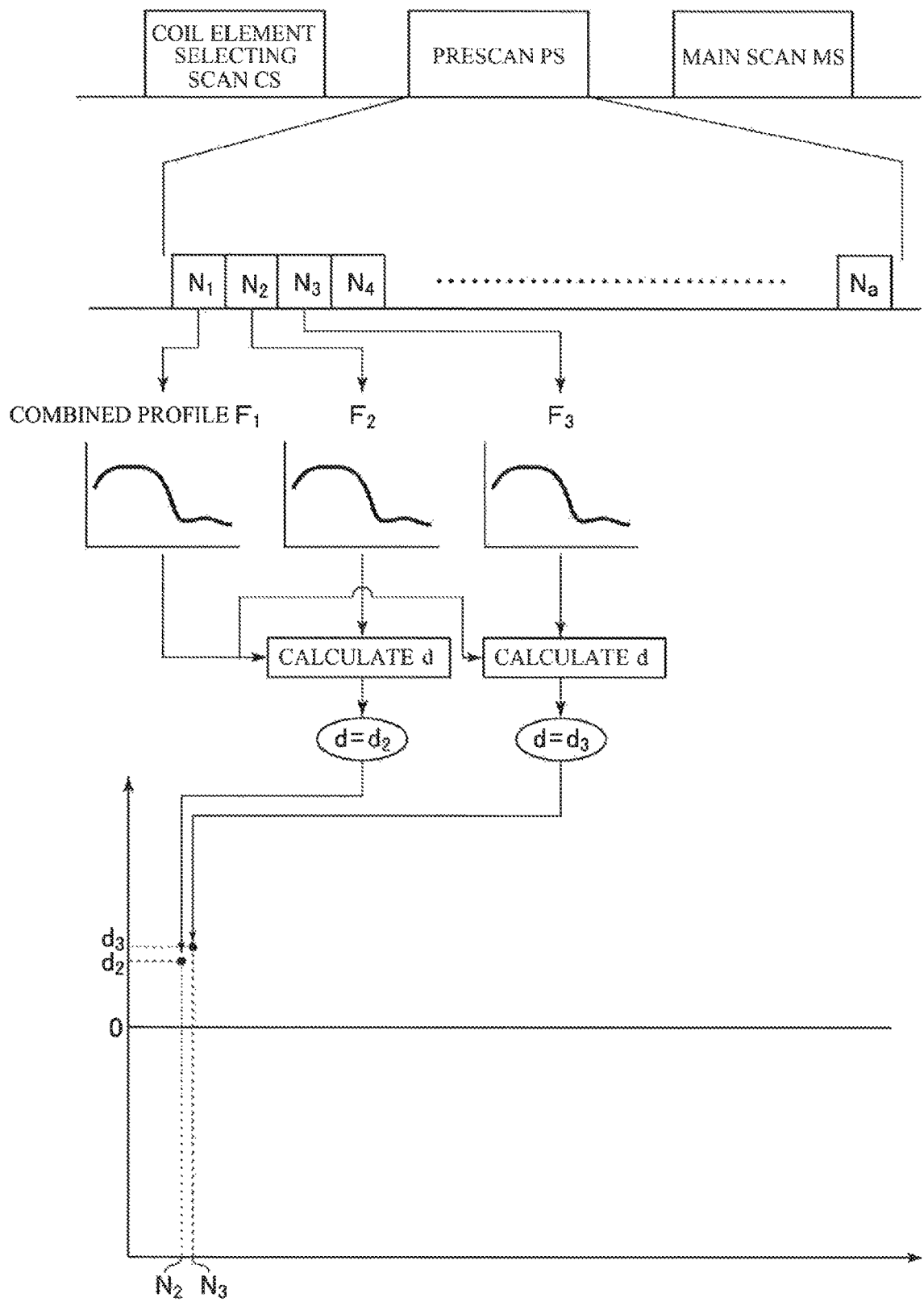
FIG. 34 is a diagram showing the amount of shift d=d3 for the combined profile $F_3$ when a squared error SE is minimized.

After performing the navigator sequence $N_2$, a next navigator sequence $N_3$ is performed. FIG. 33 shows a combined profile $F_3$ obtained by performing the navigator sequence $N_3$. After the combined profile $F_3$ is obtained, the method of LSQ is used to calculate a squared error SE between the combined profiles $F_1$ and $F_3$, and an amount of shift d of the combined profile $F_3$ relative to the combined profile $F_1$ in the SI-direction is calculated. FIG. 34 shows the amount of shift $d=d_3$ of the combined profile $F_3$ when the squared error SE is minimized It can thus be seen that the edge of the liver adjacent to the lungs has moved by $d_3$ with respect to $d=0$ while the navigator sequence $N_3$ is performed.

Figure 35:
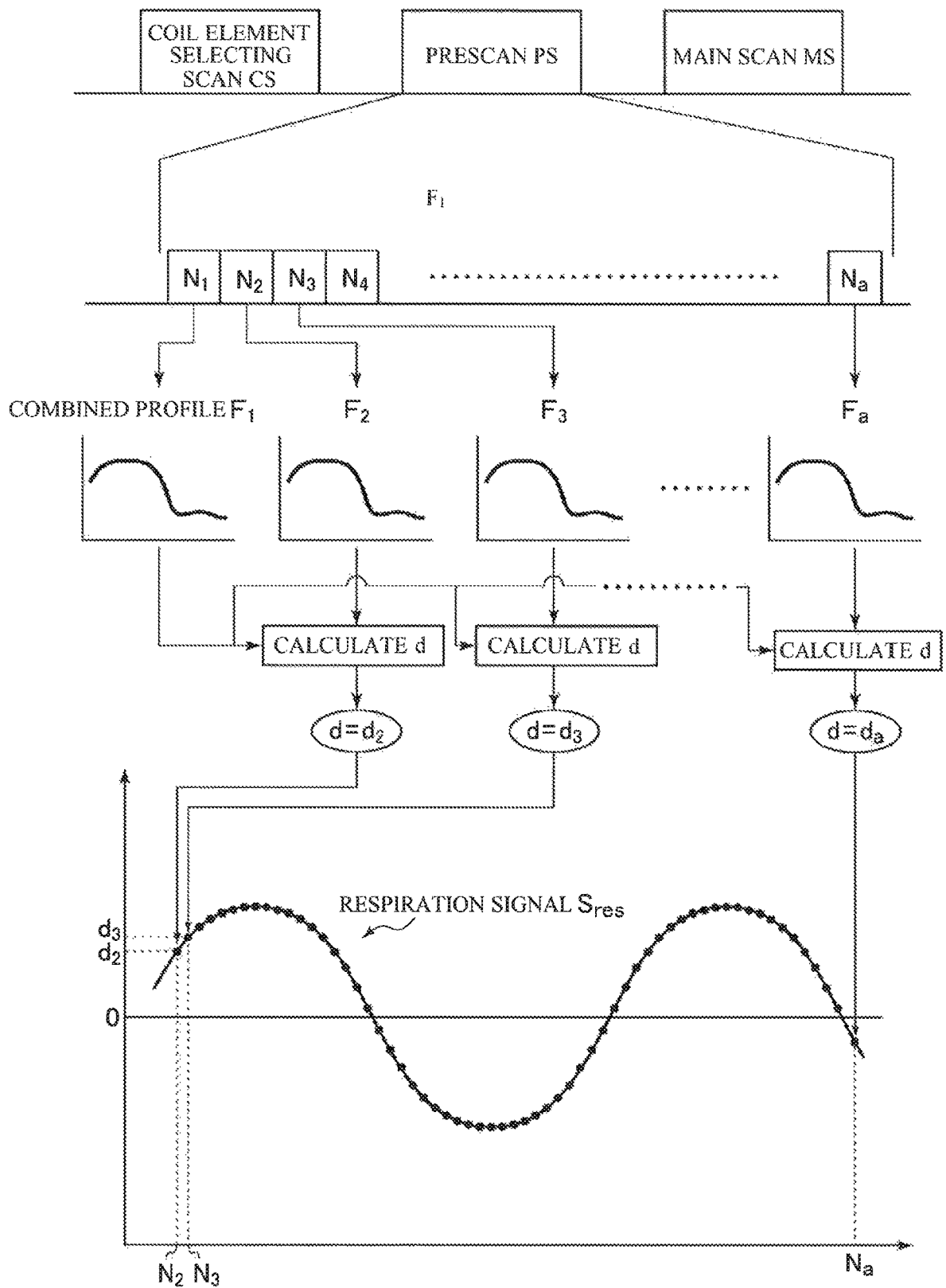
FIG. 35 is a diagram schematically showing amounts of shift d determined by performing the navigator sequences $N_1$ to $N_a$.

Similarly thereafter, the remaining navigator sequences $N_3$ to $N_a$ are performed, wherein again, a combined profile is determined and a distance d is calculated each time a navigator sequence is performed. Therefore, each time a navigator sequence is performed a value of d is determined. FIG. 35 schematically shows the amounts of shift d respectively determined by performing the navigator sequences $N_1$ to $N_a$. By determining d, one can know how much the edge of the liver adjacent to the lungs has moved with respect to $d=0$. This gives a subject's respiration signal $S_{res}$ when the prescan PS is being performed. After performing the prescan PS, the flow goes to Step ST4 (see FIG. 8).

At Step ST4, a window is defined for deciding whether or not to perform an imaging sequence in the main scan MS (Step ST5), which will be discussed later, based on the respiration signal $S_{res}$. Now a method of defining a window will be described below.

Figure 36:
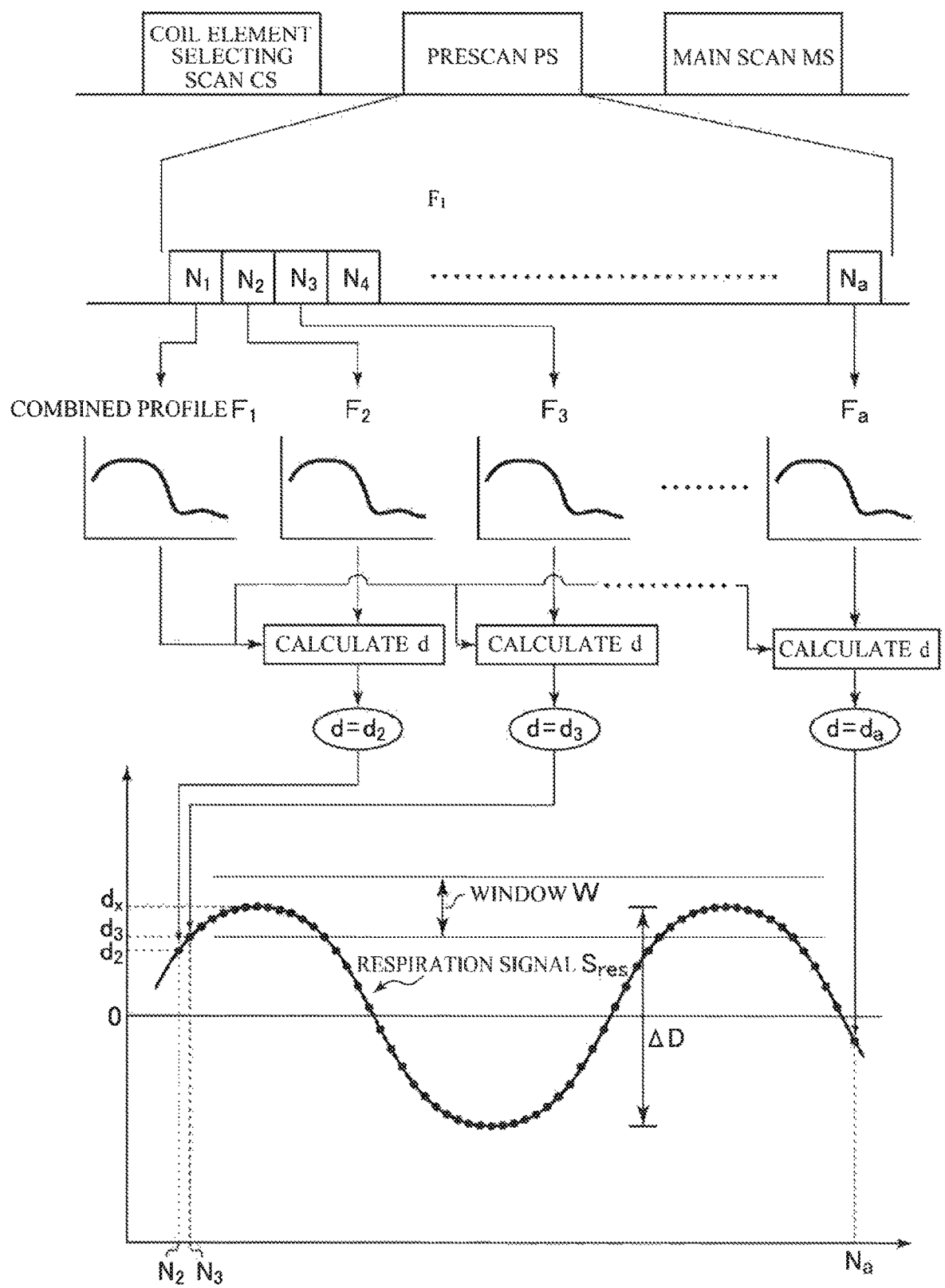
FIG. 36 is a diagram explaining a method of defining a window W.

FIG. 36 is a diagram explaining a method of defining a window W. The defining unit 97 (see FIG. 4) first detects a local maximum of the signal value of the respiration signal $S_{res}$, and calculates a signal value $d_x$ corresponding to an average of the local maxima The defining unit 97 then defines a window W based on the signal value $d_x$. For example, the window W is defined as described below.

The defining unit 97 first determines a difference $\Delta D$ between a maximum and a minimum of the respiration signal $S_{res}$. It then defines a range W of y % (y=20, for example) of the difference $\Delta D$ around the signal value $d_x$ in the middle. The thus-defined range W is determined as the window W for deciding whether to perform an imaging sequence or not. While the window W is defined here based on the signal value $d_x$ corresponding to the average of local maxima, the window W may be defined based on the signal value of the local minimum (corresponding to the average thereof), or defined based on a signal value between the local maximum and local minimum. After defining the window W, the flow goes to Step ST5.

Figure 37:
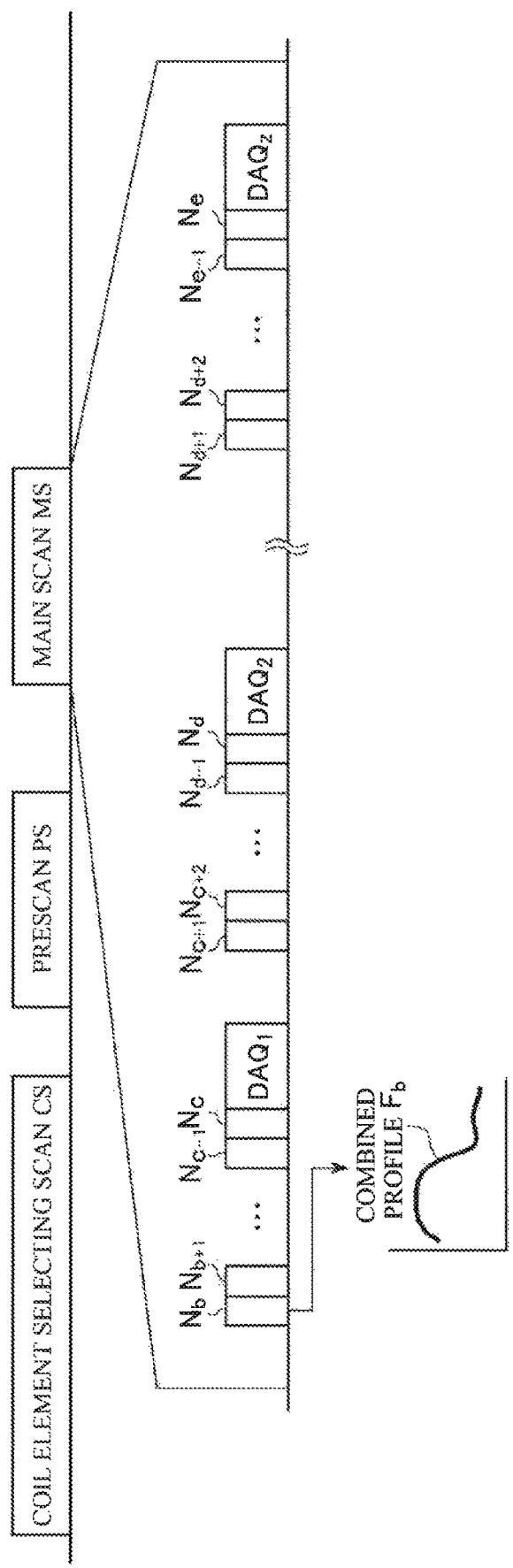
FIG. 37 is a diagram explaining the main scan MS.

At Step ST5, the main scan MS is performed. FIG. 37 is a diagram explaining the main scan MS. In the main scan MS, a navigator sequence $N_b$ for generating an MR signal containing information on respiration is first performed. Once the navigator sequence $N_b$ has been performed, the method described referring to FIGS. 28 and 29 is used to determine a combined profile $F_b$.

Figure 38:
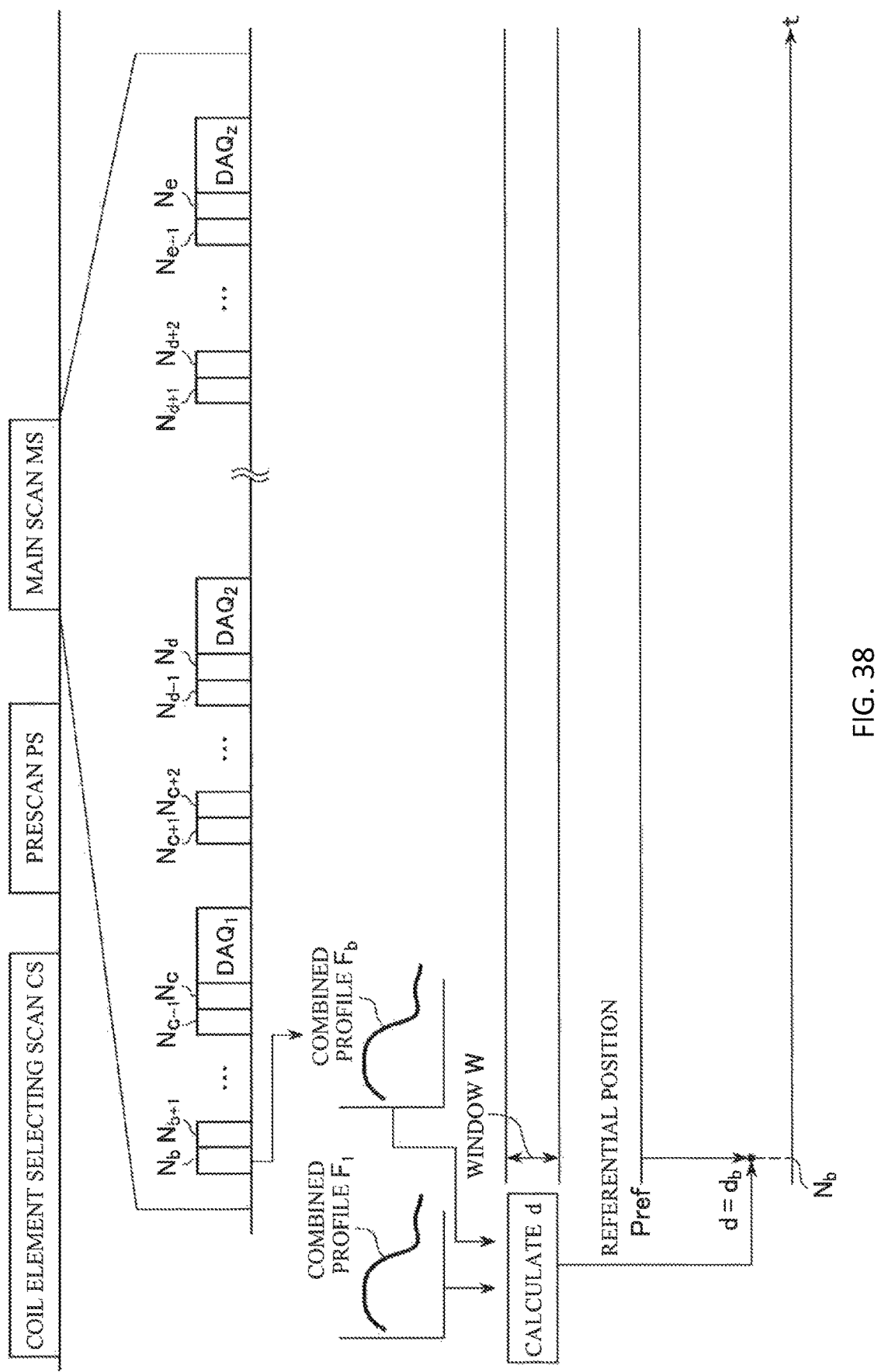
FIG. 38 is an explanatory diagram for determining a signal value of a respiration signal in the main scan MS.

After determining the combined profile $F_b$, a signal value of a respiration signal in the main scan MS is determined (see FIG. 38).

FIG. 38 is an explanatory diagram for determining a signal value of a respiration signal in the main scan MS. The signal value of a respiration signal in the main scan MS is calculated using the combined profile $F_1$ (see FIG. 29) determined in the prescan PS. The calculating unit 96 uses the method of LSQ to calculate an amount of shift d=$d_b$ of the combined profile $F_b$ when a squared error SE between the combined profiles $F_1$ and $F_b$ is minimized The value $d_b$ is used as the signal value of a respiration signal when the navigator sequence $N_b$ in the main scan MS is performed.

Figure 39:
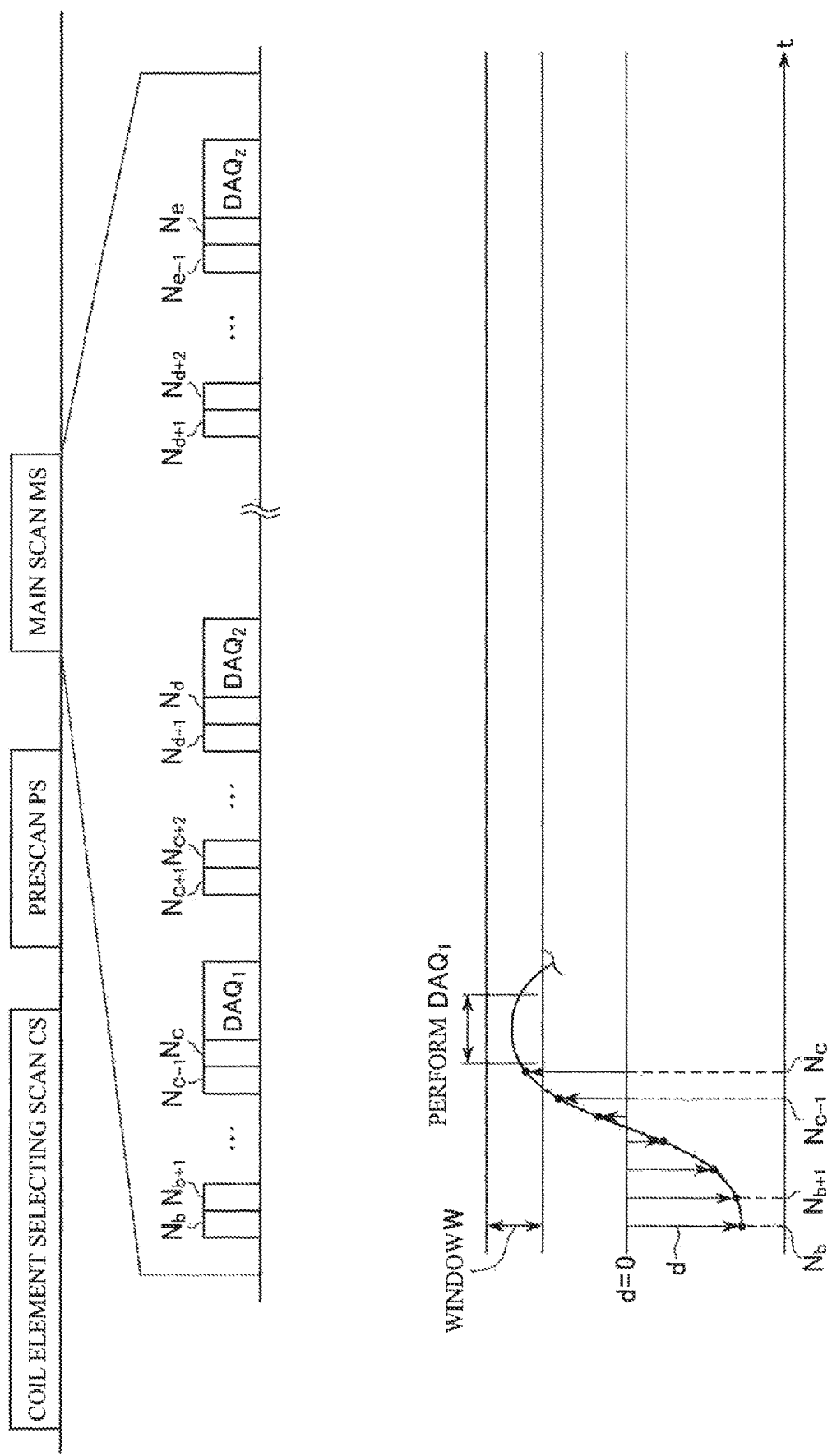
FIG. 39 is a diagram schematically showing the amount of shift d for the combined profile calculated for each of the navigator sequences $N_b$ to $N_c$.

Similarly thereafter, the navigator sequence for generating an MR signal containing information on respiration is performed, and an amount of shift d is calculated for a combined profile when the squared error SE is minimized FIG. 39 schematically shows amounts of shift d for combined profiles respectively calculated for navigator sequences $N_b$ to $N_c$. While the signal value of a respiration signal falls outside of the window W for the navigator sequences $N_b$ to $N_{c-1}$ in FIG. 39, it enters the inside of the window W for the navigator sequence $N_c$. Therefore, an imaging sequence $DAQ_1$ for generating an MR signal containing image information for the subject is performed immediately after performing the navigator sequence $N_c$.

Figure 40:
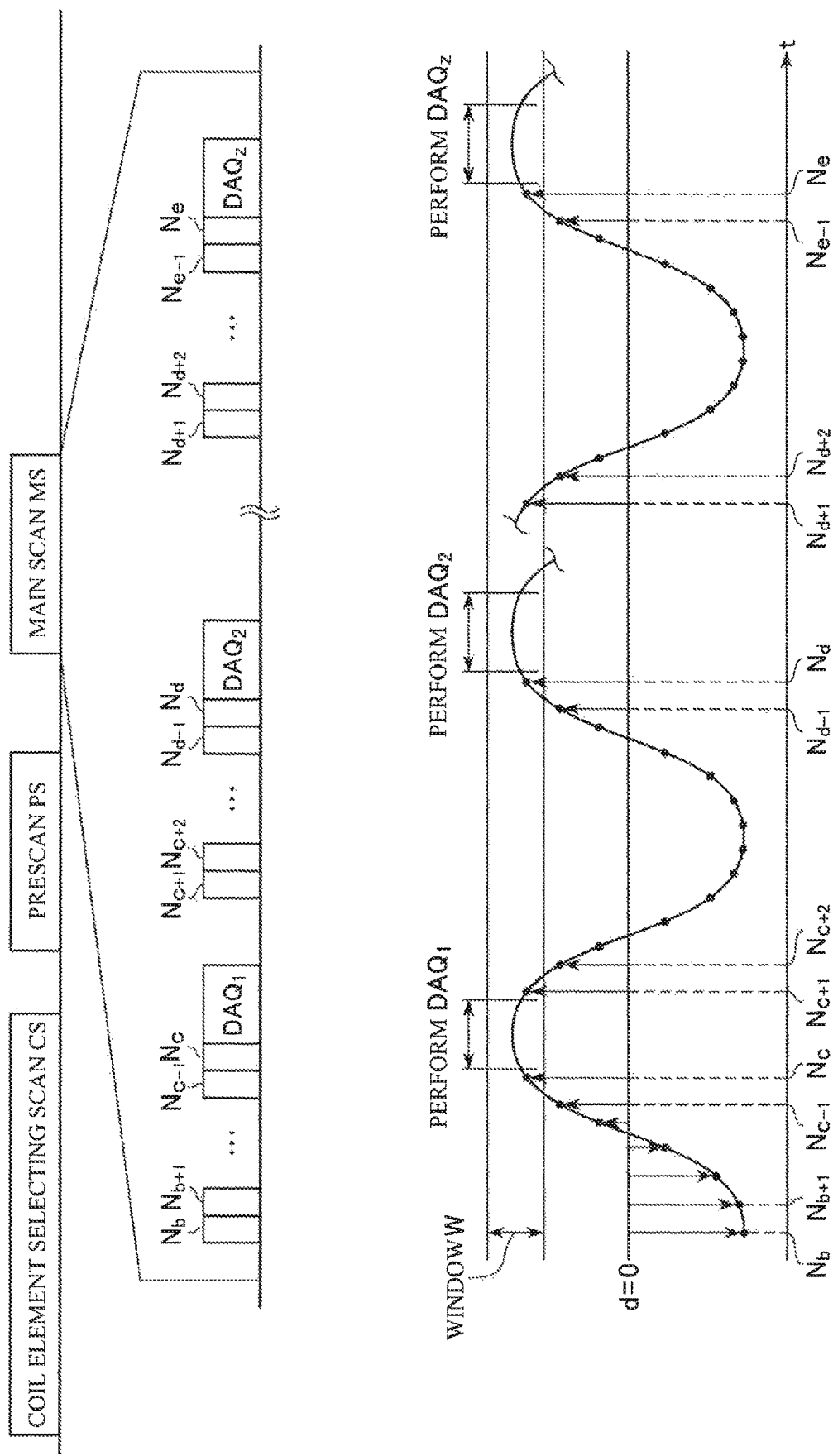
FIG. 40 is a diagram schematically showing the situation where the last imaging sequence $DAQ_z$ is performed.

After performing the imaging sequence $DAQ_1$, a navigator sequence is performed again, an amount of shift d of a combined profile when the squared error SE is minimized is calculated, and an imaging sequence for generating an MR signal containing image information for the subject is performed once the signal value of a respiration signal has entered the window W. FIG. 40 schematically shows the situation where the last imaging sequence $DAQ_z$ is performed. Once the last imaging sequence $DAQ_z$ has been performed, the main scan MS is terminated. The imaging sequences performed in the main scan MS give imaging data. It should be noted that when the imaging sequence is performed, imaging data is obtained not only from the eight coil elements ($E_3$, $E_4$, $E_5$, $E_6$, $E_{11}$, $E_{12}$, $E_{13}$, $E_{14}$) selected at Step ST2 but also from the eight other coil elements ($E_1$, $E_2$, $E_7$, $E_8$, $E_9$, $E_{10}$, $E_{15}$, $E_{16}$) that are not selected at Step ST2. Then, an image of the body part to be imaged is produced based on imaging data obtained by all the (sixteen) coil elements. It should be noted that the image of the body part to be imaged may also be produced without using imaging data obtained by part of the sixteen coil elements. In this way, the flow is completed.

According to the present embodiment, a coil element selecting scan CS is performed before performing a prescan PS, to determine a frequency spectrum for each coil element (see FIG. 17). Then, coil elements that can receive an MR signal fully reflecting a respiration-induced motion are selected from among the coil elements $E_1$ to $E_{16}$ based on the frequency spectra respectively obtained for the coil elements. Therefore, in the prescan PS, a respiration signal may be obtained with high quality because it is obtained using the selected coil elements. Moreover, in the main scan MS, an image with high quality having reduced artifacts may be obtained because a signal value of the respiration signal is determined using the selected coil elements and an imaging sequence is performed when the signal value of the respiration signal enters a window W.

According to the present embodiment, in combining profiles, the profiles are weighted with ratios H and the weighted profiles are added together to thereby create a combined profile. The ratio H has a greater value when the peak (Q or R) corresponding to respiratory motion is higher. Therefore, by applying weighting to the profile with the ratio H, the profile is weighted so that the signal value in the profile increases as a frequency component reflecting respiratory motion among those included in a frequency spectrum becomes greater; therefore, a respiration signal with high quality reflecting respiratory motion more may be determined. It should be noted that non-weighted profiles may be added together to determine a combined profile insofar as a respiration signal can be determined with high quality.

Figure 41:
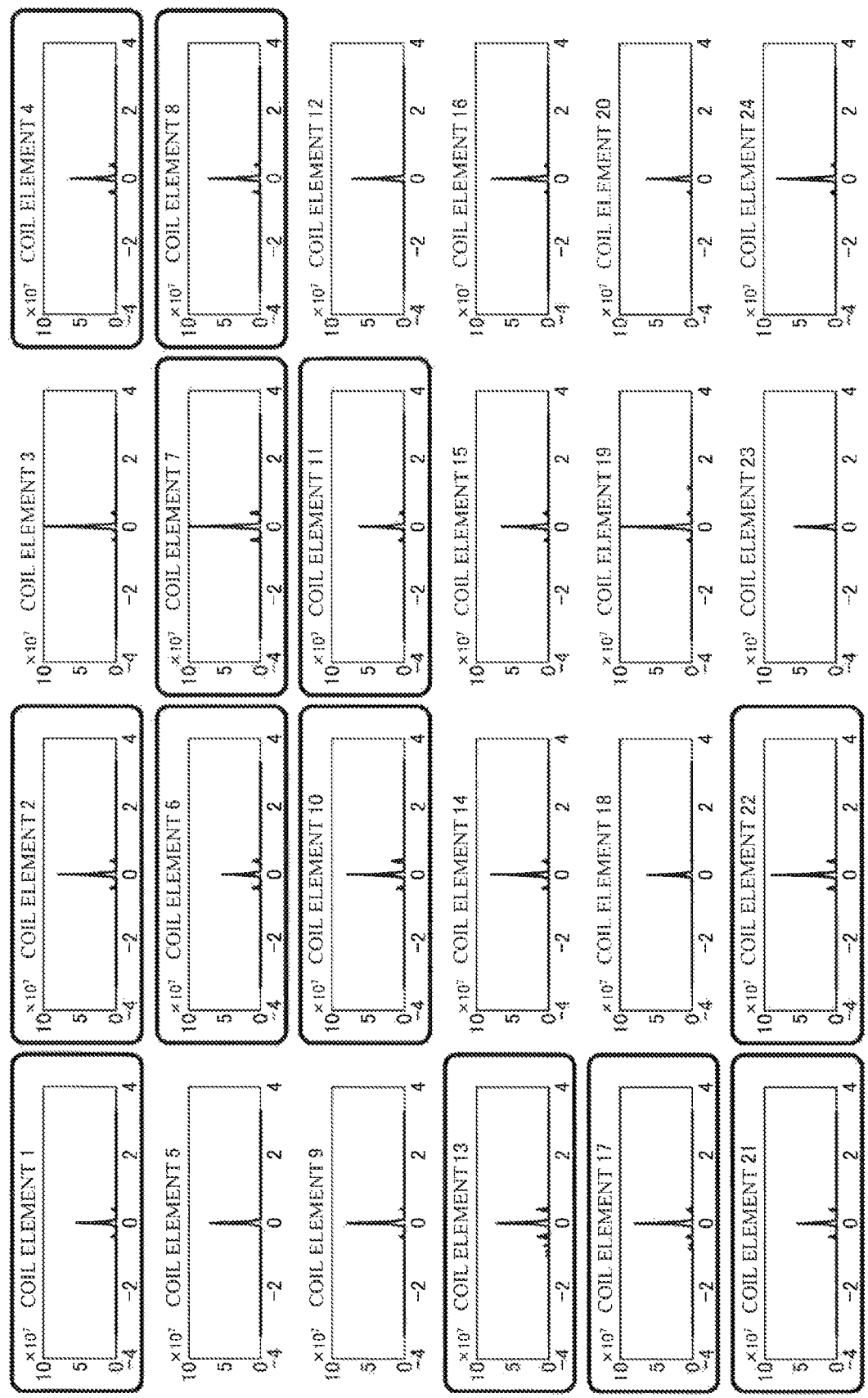
FIG. 41 is a diagram showing actually obtained frequency spectra.

As described above, according to the present embodiment, coil elements that can receive an MR signal fully reflecting respiration-induced motion may be selected by determining a frequency spectrum for each coil element. To verify this, a receive coil apparatus used in actual measurement on a subject was used to determine a frequency spectrum for each coil element. FIG. 41 shows actually obtained frequency spectra. FIG. 41 shows frequency spectra obtained using a receive coil apparatus comprising twenty-four coil elements. Frequency spectra enclosed by a bold line in FIG. 41 represent ones including a peak fully reflecting respiration-induced motion. It can thus be seen that coil elements that can receive an MR signal fully reflecting respiration-induced motion may be selected from among the twenty-four coil elements.

According to the present embodiment, a coil element selecting scan CS is performed, and then, a prescan PS is performed to determine a respiration signal $S_{res}$ based on a navigator signal obtained by the prescan PS (see FIG. 35). However, the respiration signal $S_{res}$ may be determined based on navigator signals $A_{11}$ to $A_{a16}$ obtained by the coil element selecting scan CS without performing the prescan PS after performing the coil element selecting scan CS. The producing unit 94 produces a profile representing a change of signal intensity in the z-direction (SI-direction) from each of the navigator signals obtained by the selected coil elements, and the combining unit 95 combines the produced profiles together to thereby provide a combined profile. Since a combined profile is thus obtained for each navigator sequence in the coil element selecting scan CS, a signal value of a respiration signal $S_{res}'$ when the coil element selecting scan CS is being performed may be determined. A window W may be determined based on the respiration signal $S_{res}'$. Since in this method, the respiration signal $S_{res}$ for determining a window W may be obtained without performing a prescan PS, the total time taken in imaging of a subject may be reduced.

According to the present embodiment, the receive coil apparatus 4 is used as a coil dedicated for reception of MR signals. However, the receive coil apparatus 4 may be configured to achieve both reception and transmission of MR signals.

According to the present embodiment, in performing a navigator sequence, a readout gradient pulse RE (see FIG. 6) is applied after applying an excitation pulse $EX_1$. However, MR signals may be collected without applying the readout gradient pulse RE.

According to the present embodiment, a respiration signal is exemplified as a subject's body-motion signal. However, the present invention is not limited to acquisition of respiration signals. For example, a heart beats with a period of about one second, and therefore, it is considered that a peak reflecting cardiac motion appears near 1 Hz. Accordingly, a coil element(s) that gives a frequency spectrum having a high peak reflecting cardiac motion may be selected from among a plurality of coil elements, whereby it is possible to obtain heart-beat signals.

What is claimed is:

1. A magnetic resonance imaging apparatus comprising:
   a scanning section for performing a first sequence a plurality of number of times, said first sequence being for generating a first MR signal containing information on body motion from a moving body part in a subject;
   a coil apparatus having a plurality of coil elements for receiving said first MR signal;
   a signal analyzing unit for obtaining data, said signal analyzing unit determining a feature quantity of a navigator signal containing information on said first MR signal received by each of said plurality of coil elements, and obtaining data representing a temporal change of said feature quantity for each said coil element;
   a transforming unit for transforming said data obtained for each said coil element into a frequency spectrum;
   a selecting unit for selecting a coil element for determining a signal value of a body-motion signal for said subject from among said plurality of coil elements based on said frequency spectrum; and
   wherein said selecting unit detects a first peak reflecting motion of said moving body part, a second peak reflecting motion of said moving body part, and a third peak not reflecting motion of said moving body part from among a plurality of peaks contained in said frequency spectrum, and determines a ratio between one of peak values of said first and second peaks and the peak value of said third peak for each said coil element to select said coil element based on said ratio.

2. The magnetic resonance imaging apparatus as recited in claim 1, wherein said scanning section performs a first scan for selecting a coil element, and said first sequence is performed a plurality of number of times in said first scan.

3. The magnetic resonance imaging apparatus as recited in claim 2, further comprising:
   a producing unit for producing a profile representing a change of signal intensity for said moving body part in a specified direction based on a navigator signal containing information on said first MR signal received by the coil element selected by said selecting unit; and
   a determining unit for determining, based on said profile, a signal value of the body-motion signal when said first scan is being performed.

4. The magnetic resonance imaging apparatus as recited in claim 2, wherein:
   said scanning section performs a second scan for determining a respiration signal for the subject, and
   in said second scan, a second sequence is performed a plurality of number of times, said second sequence being for generating a second MR signal containing information on body motion from said moving body part in said subject.

5. The magnetic resonance imaging apparatus as recited in claim 4, further comprising:
   a producing unit for producing a profile representing a change of signal intensity for said moving body part in a specified direction based on a navigator signal containing information on said second MR signal received by the coil element selected by said selecting unit; and
   a determining unit for determining, based on said profile, a signal value of the body-motion signal when said second scan is being performed.

6. The magnetic resonance imaging apparatus as recited in claim 3, wherein:
   said selecting unit selects two or more coil elements from among said plurality of coil elements,
   said producing unit produces two or more profiles corresponding to the two or more selected coil elements, and
   said unit for determining a body-motion signal determines a combined profile by combining said two or more profiles together, and determines a signal value of said body-motion signal based on said combined profile.

7. The magnetic resonance imaging apparatus as recited in claim 6, wherein said unit for determining a body-motion signal applies weighting to each of said two or more profiles with said ratio determined for each of said two or more coil elements, and determines said combined profile by adding said two or more weighted profiles together.

8. The magnetic resonance imaging apparatus as recited in claim 3, wherein:
   said scanning section performs a third scan for acquiring an image of a body part to be imaged in the subject, and
   in said third scan, a third sequence for generating a third MR signal containing information on body motion from said moving body part in said subject, and a fourth sequence for generating a fourth MR signal containing image information for said subject are performed.

9. The magnetic resonance imaging apparatus as recited in claim 8, comprising a defining unit for defining, based on said body-motion signal, a window for deciding whether to perform said fourth sequence or not.

10. The magnetic resonance imaging apparatus as recited in claim 1, wherein said first sequence has a readout gradient pulse applied after an RF pulse.

11. The magnetic resonance imaging apparatus as recited in claim 1, wherein said feature quantity is a peak value of said navigator signal, a signal value of said navigator signal at a center of k-space, or an area of said navigator signal.

12. The magnetic resonance imaging apparatus as recited in claim 1, wherein said body-motion signal is a respiration signal.

13. A method for a magnetic resonance imaging (MRI) apparatus, the MM apparatus comprising a plurality of coil elements for receiving MR signals, the method comprising:
   performing a first sequence a plurality of number of times, said first sequence being for generating a first MR signal containing information on body motion from a moving body part in a subject;
   determining a feature quantity of a navigator signal containing information on said first MR signal received by each of said plurality of coil elements;
   obtaining data representing a temporal change of said feature quantity for each said coil element;
   transforming said data obtained for each said coil element into a frequency spectrum;
   selecting a coil element for determining a signal value of a body-motion signal for said subject from among said plurality of coil elements based on said frequency spectrum; and
   wherein said selecting includes detecting a first peak reflecting motion of said moving body part, a second peak reflecting motion of said moving body part, and a third peak not reflecting motion of said moving body part from among a plurality of peaks contained in said frequency spectrum, determining a ratio between one of peak values of said first and second peaks and the peak value of said third peak for each said coil element, and selecting said coil element based on said ratio.

14. The method of claim 13, further comprising:
producing a profile representing a change of signal intensity for said moving body part in a specified direction based on the navigator signal containing information on said first MR signal received by the selected coil element; and
determining, based on said profile, a signal value of the body-motion signal when said first scan is being performed.

15. The method of claim 13, further comprising:
selecting two or more coil elements from among said plurality of coil elements;
producing two or more profiles corresponding to the two or more selected coil elements; and
determining a combined profile by combining said two or more profiles together; and
determining a signal value of said body-motion signal based on said combined profile.

16. The method of claim 13, further comprising performing a second scan for determining a respiration signal for the subject, wherein said second scan, a second sequence is performed a plurality of number of times, said second sequence being for generating a second MR signal containing information on body motion from said moving body part in said subject.

* * * * *